United States Patent
Prest et al.

(10) Patent No.: US 9,430,102 B2
(45) Date of Patent: Aug. 30, 2016

(54) TOUCH INTERFACE USING PATTERNED BULK AMORPHOUS ALLOY

(75) Inventors: Christopher D. Prest, San Francisco, CA (US); Matthew S. Scott, Campbell, CA (US); Stephen P. Zadesky, Portola Valley, CA (US); Dermot J. Stratton, San Francisco, CA (US); Joseph C. Poole, San Francisco, CA (US)

(73) Assignee: APPLE, Cupertino, CA (US)

( * ) Notice: Subject to any disclaimer, the term of this patent is extended or adjusted under 35 U.S.C. 154(b) by 857 days.

(21) Appl. No.: 13/541,845

(22) Filed: Jul. 5, 2012

(65) Prior Publication Data

US 2014/0009215 A1    Jan. 9, 2014

(51) Int. Cl.
G06F 3/044    (2006.01)
C22C 45/00    (2006.01)
H01B 1/02    (2006.01)
H03K 17/96    (2006.01)

(52) U.S. Cl.
CPC ......... *G06F 3/044* (2013.01); *B32B 2457/202* (2013.01); *C22C 45/00* (2013.01); *H01B 1/02* (2013.01); *H03K 17/96* (2013.01)

(58) Field of Classification Search
None
See application file for complete search history.

(56) References Cited

U.S. PATENT DOCUMENTS

| | | | |
|---|---|---|---|
| 4,450,041 A | 5/1984 | Aklufi | |
| 4,661,201 A | 4/1987 | Petridis | |
| 5,288,344 A | 2/1994 | Peker | |
| 5,368,659 A | 11/1994 | Peker | |
| 5,618,359 A | 4/1997 | Lin | |
| 5,648,642 A | 7/1997 | Miller | |
| 5,735,975 A | 4/1998 | Lin | |
| 6,117,725 A | 9/2000 | Huang | |
| 6,200,893 B1 | 3/2001 | Sneh | |
| 6,325,868 B1 | 12/2001 | Kim | |
| 6,452,514 B1 | 9/2002 | Philipp | |
| 6,652,679 B1 * | 11/2003 | Inoue et al. | 148/561 |
| 6,780,766 B2 * | 8/2004 | Basceri et al. | 438/676 |
| 7,575,040 B2 | 8/2009 | Johnson | |
| 7,859,521 B2 | 12/2010 | Hotelling | |
| 7,986,152 B2 * | 7/2011 | Philipp et al. | 324/662 |
| 7,995,041 B2 | 8/2011 | Chang | |
| 2007/0079907 A1 | 4/2007 | Johnson | |
| 2008/0118387 A1 | 5/2008 | Demetriou | |
| 2008/0309623 A1 | 12/2008 | Hotelling | |

(Continued)

FOREIGN PATENT DOCUMENTS

JP    2001-303218    10/2001

OTHER PUBLICATIONS

Inoue et al., "Bulk amorphous alloys with high mechanical strength and good soft magnetic properties in Fe—Tm—B (TM=IV-VIII group transition metal) system", Appl. Phys. Lett., vol. 71, p. 464 (1997).

(Continued)

*Primary Examiner* — Gwendolyn Blackwell
*Assistant Examiner* — Anthony J Frost
(74) *Attorney, Agent, or Firm* — Brownstein Hyatt Farber Schreck

(57) ABSTRACT

Touch sensing systems comprising bulk-solidifying amorphous alloys and methods of making touch sensing arrays and electronic devices containing touch sensitive screens that include arrays containing bulk-solidifying amorphous alloys. The bulk-solidifying amorphous alloy substrates have select areas of crystalline and amorphous alloy providing for discrete areas of conductivity and resistivity.

20 Claims, 14 Drawing Sheets

(56) References Cited

U.S. PATENT DOCUMENTS

| | | |
|---|---|---|
| 2010/0084052 A1 | 4/2010 | Farmer |
| 2010/0300148 A1 | 12/2010 | Demetriou |
| 2011/0278078 A1* | 11/2011 | Schediwy et al. ......... 178/18.06 |
| 2012/0262385 A1* | 10/2012 | Kim ....................... G06F 3/044 345/173 |

OTHER PUBLICATIONS

Shen Et., "Bulk Glassy $CO43FE2OTA5.5B31.5$ Alloy with High Glass-Forming Ability and Good Soft Magnetic Properties", Materials Transactions, vol. 42 No. 10 (2001) pp. 2136-2139.

* cited by examiner

TOUCH INTERFACE USING PATTERNED BULK AMORPHOUS ALLOY

FIELD OF THE INVENTION

The present invention relates to touch interface materials comprising patterned bulk amorphous alloys and methods of making touch interface materials by patterning bulk amorphous alloys.

BACKGROUND

A touchscreen is an electronic visual display that can detect the presence and location of a touch within the display area. The term generally refers to touching the display of the device with a finger or hand. Touchscreens also can sense other passive objects, such as a stylus. Touchscreens are common in devices such as all-in-one computers, tablet computers, and smartphones.

The touchscreen has two main attributes. First, it enables one to interact directly with what is displayed, rather than indirectly with a pointer controlled by a mouse or touchpad. Secondly, it lets one do so without requiring any intermediate device that would need to be held in the hand. Such displays can be attached to computers, or to networks as terminals. They also play a prominent role in the design of digital appliances such as the personal digital assistant (PDA), satellite navigation devices, mobile phones, and video games.

Touch panel sensors disposed on the front side of an image display device and used as an input switch integral with the image display device are easy to use, and thus have been widely used in operation screens of, for example, an automated teller machine of a bank, a ticket-vending machine, a car navigation system, a PDA, a copy machine, and the like. Detection mechanisms of an input point include a resistance film type, a capacitance type, an optical type, an ultrasonic surface elastic wave type, a piezoelectric type, and the like. Among them, the resistance film type detection mechanism is most widely used because of low cost, simple structure, and the like.

The resistance film type touch panel sensor mainly includes an upper electrode, a lower electrode, and a tail. A transparent conductive film provided on a substrate (for example, a film substrate) included in the upper electrode, and a transparent conductive film provided on another substrate (for example, a glass substrate) included in the lower electrode are opposed to each other via a spacer. When a finger, a pen, or the like touches the film side of such a touch panel sensor, both transparent conductive films are brought into contact with each other, so that current flows through the electrodes on both ends of the transparent conductive films. And, a voltage division ratio due to resistances of the respective transparent conductive films is measured thereby to detect the touched position.

While the resistance film type touch panel is capable of detecting stylus, finger, or other devices touching the screen, they suffer from the drawback of accidental activation of the device when the screen accidentally comes into contact with an object, which is common when the device is stored in a purse, a holder, a pocket, and the like. Other types of sensors used with touch screen panels include surface acoustic wave, capacitive, including surface capacitance, projected capacitance, mutual capacitance, self-capacitance, infrared sensors, ultrasonic or acoustic pulse recognition, dispersive signal technology, and optical sensors. Capacitive touch sensor panels have received widespread acceptance in the industry.

Capacitive touch sensor panels can be formed from a matrix of drive and sense lines of a substantially transparent conductive material, such as Indium Tin Oxide (ITO), often arranged in rows and columns in horizontal and vertical directions on a substantially transparent substrate. It is due in part to their substantial transparency that capacitive touch sensor panels can be overlaid on a display to form a touch screen, as described in, for example, U.S. Patent Application Publication No. 2008/0309623, the disclosure of which is incorporated by reference herein in its entirety. Other capacitive touch sensor panels are formed underneath the screen and are comprised of a matrix of drive and sense lines of conductive material present on a substrate.

One such example is an integrated touch screen in which multi-functional elements form a part of the display circuitry of the display system, and can also form part of the touch sensing circuitry of a touch sensing system that senses one or more touches on or near the display. Such an integrated touch screen is disclosed in, for example, U.S. Pat. Nos. 7,859,521, and 7,995,041, the disclosures of each of which are incorporated by reference herein in their entirety.

The present embodiments relate to improved touch sensing arrays that provide resistive or capacitive sensing capabilities. The description herein of advantages or disadvantages of known apparatus, methods, and systems is not intended to limit the scope of the embodiments to their inclusion or exclusion. Indeed, some embodiments may include one or more known apparatus, methods, or systems, without suffering from the disadvantages described herein.

SUMMARY

A proposed solution according to embodiment herein for improved touch sensing systems that provide resistive or capacitive sensing capabilities is to use bulk-solidifying amorphous alloys as a substrate material and to form the array on the bulk-solidifying amorphous alloy. In accordance with these and other embodiments, there is provided a bulk-solidifying amorphous alloy substrate having positioned therein an array of conducting tracers (or wires) in electrical connection with a plurality of discrete areas of crystalline alloy forming sense elements and/or drive elements, and/or multi-function circuit elements, the substrate further having positioned thereon a plurality of discrete areas of amorphous alloy. The conducting tracers are connected to a control unit to process the information provided by sense elements and/or drive elements, and/or multi-function circuit elements and determine the position of the sensed element.

In accordance with an additional embodiment, there is provided a method of making a bulk-solidifying amorphous alloy substrate material comprising discrete areas of amorphous alloy and crystalline alloy that includes providing a substrate of a bulk-solidifying amorphous alloy having an upper and lower surface. The method includes forming in at least one of the upper or lower surfaces of the substrate discrete areas of crystalline alloy by subjecting the discrete areas to radiation sufficient to increase the temperature of the bulk-solidifying amorphous alloy above its glass transition temperature and below its melting temperature, and then cooling the heated discrete areas so that the alloy forms a crystalline structure in the discrete areas, thereby forming a plurality of circuit elements at each discrete area crystalline in structure. The method also includes providing a plurality of conducing tracers, and electrically connecting the plurality of conducting tracers to the plurality of circuit elements.

In accordance with an additional embodiment, there is provided an electronic device that includes a touch sensor that comprises as one of its components a bulk-solidifying amorphous alloy substrate having positioned therein an array of conducting wires in electrical connection with a plurality of discrete areas of crystalline alloy, the substrate further having positioned thereon a plurality of discrete areas of amorphous alloy.

DETAILED DESCRIPTION

All publications, patents, and patent applications cited in this Specification are hereby incorporated by reference in their entirety.

The articles "a" and "an" are used herein to refer to one or to more than one (i.e., to at least one) of the grammatical object of the article. By way of example, "a polymer resin" means one polymer resin or more than one polymer resin. Any ranges cited herein are inclusive. The terms "substantially" and "about" used throughout this Specification are used to describe and account for small fluctuations. For example, they can refer to less than or equal to ±5%, such as less than or equal to ±2%, such as less than or equal to ±1%, such as less than or equal to ±0.5%, such as less than or equal to ±0.2%, such as less than or equal to ±0.1%, such as less than or equal to ±0.05%.

Bulk-solidifying amorphous alloys, or bulk metallic glasses ("BMG"), are a recently developed class of metallic materials. These alloys may be solidified and cooled at relatively slow rates, and they retain the amorphous, non-crystalline (i.e., glassy) state at room temperature. Amorphous alloys have many superior properties than their crystalline counterparts. However, if the cooling rate is not sufficiently high, crystals may form inside the alloy during cooling, so that the benefits of the amorphous state can be lost. For example, one challenge with the fabrication of bulk amorphous alloy parts is partial crystallization of the parts due to either slow cooling or impurities in the raw alloy material. As a high degree of amorphicity (and, conversely, a low degree of crystallinity) is desirable in BMG parts, there is a need to develop methods for casting BMG parts having controlled amount of amorphicity.

Figure 1:
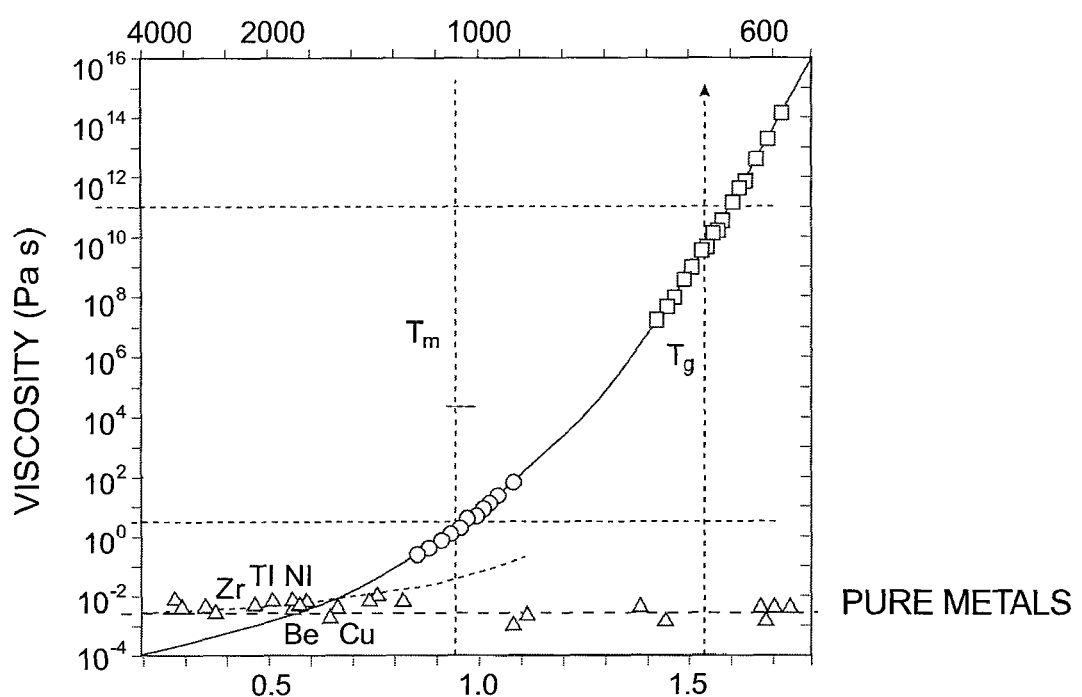
FIG. 1 provides a temperature-viscosity diagram of an exemplary bulk solidifying amorphous alloy.

FIG. 1 shows a viscosity-temperature graph of an exemplary bulk solidifying amorphous alloy, from the VIT-001 series of Zr—Ti—Ni—Cu—Be family manufactured by Liquidmetal Technology. It should be noted that there is no clear liquid/solid transformation for a bulk solidifying amorphous metal during the formation of an amorphous solid. The molten alloy becomes more and more viscous with increasing undercooling until it approaches solid form around the glass transition temperature. Accordingly, the temperature of solidification front for bulk solidifying amorphous alloys can be around glass transition temperature, where the alloy will practically act as a solid for the purposes of pulling out the quenched amorphous sheet product.

Figure 2:
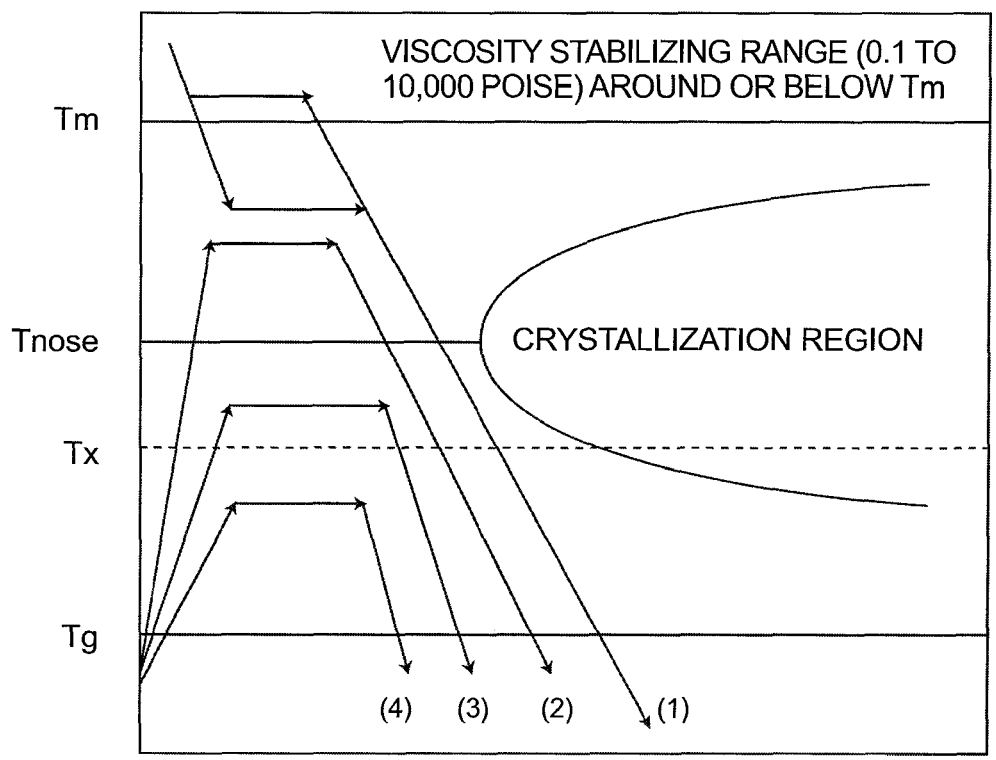
FIG. 2 provides a schematic of a time-temperature-transformation (TTT) diagram for an exemplary bulk solidifying amorphous alloy.
Figure 3:
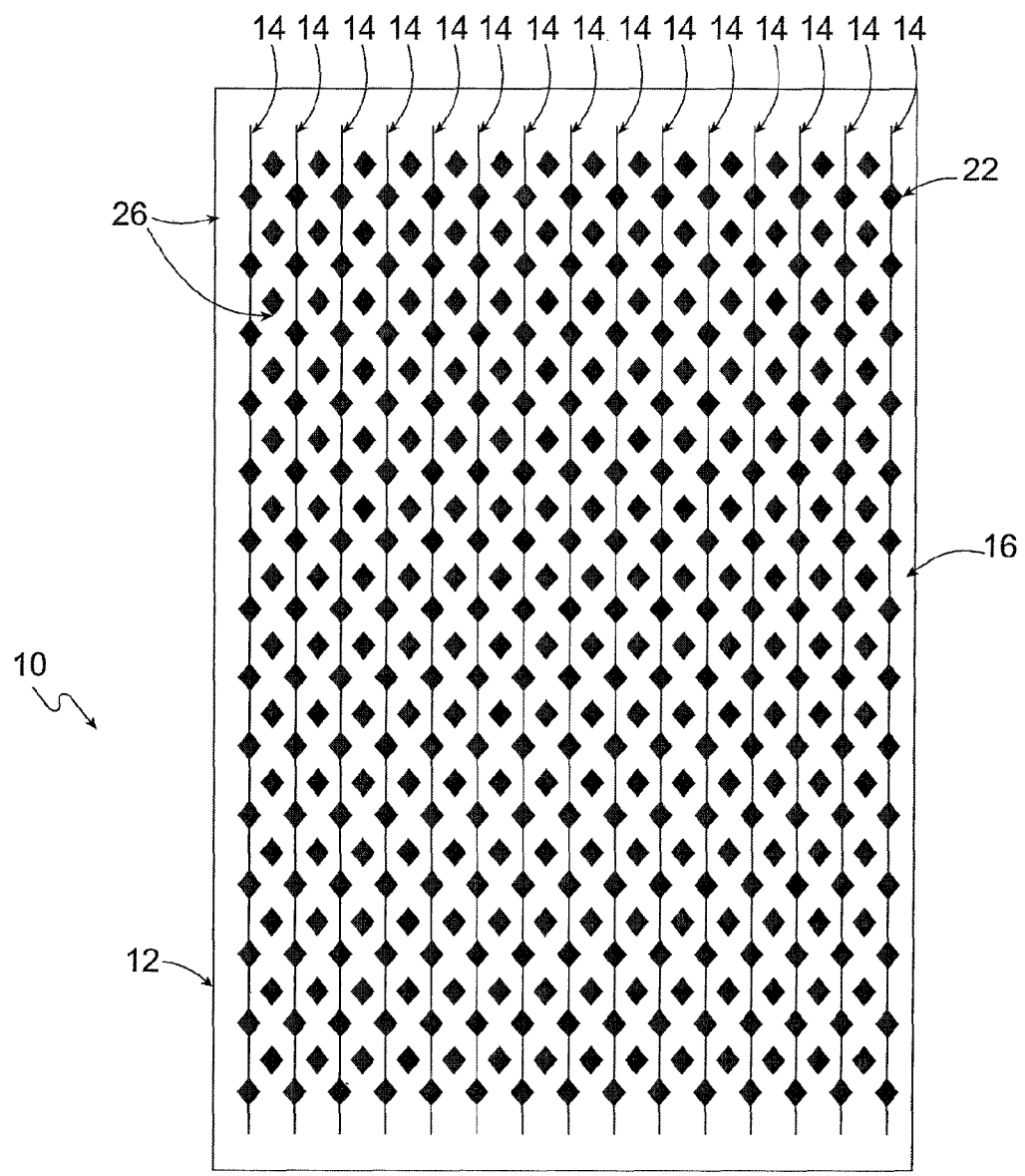
FIG. 3 is a top view of an object position sensor transducer according to a preferred embodiment of the invention showing the object position sensor surface layer including a top conductive trace layer and conductive pads connected to a bottom trace layer.
Figure 4:
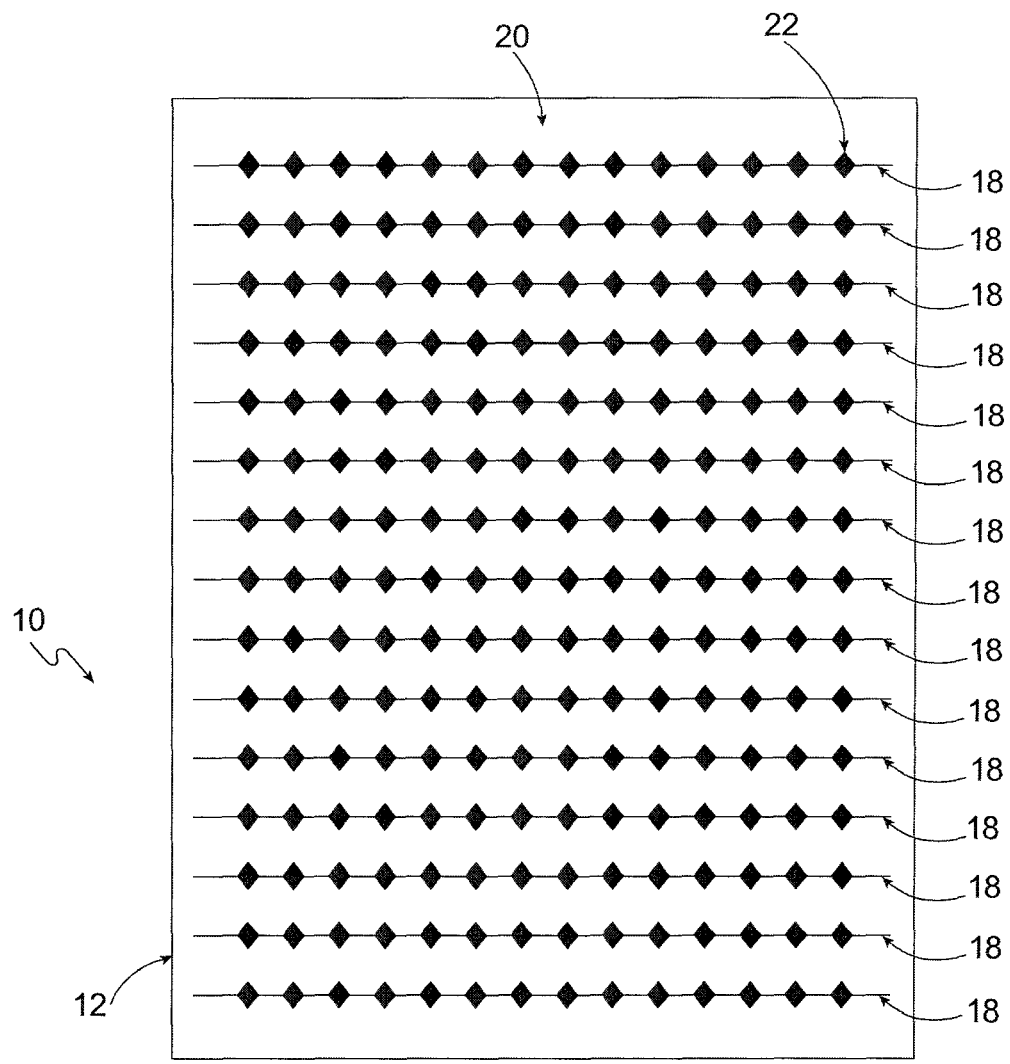
FIG. 4 is a bottom view of the object position sensor transducer of FIG. 3 a showing the bottom conductive trace layer.
Figure 5:
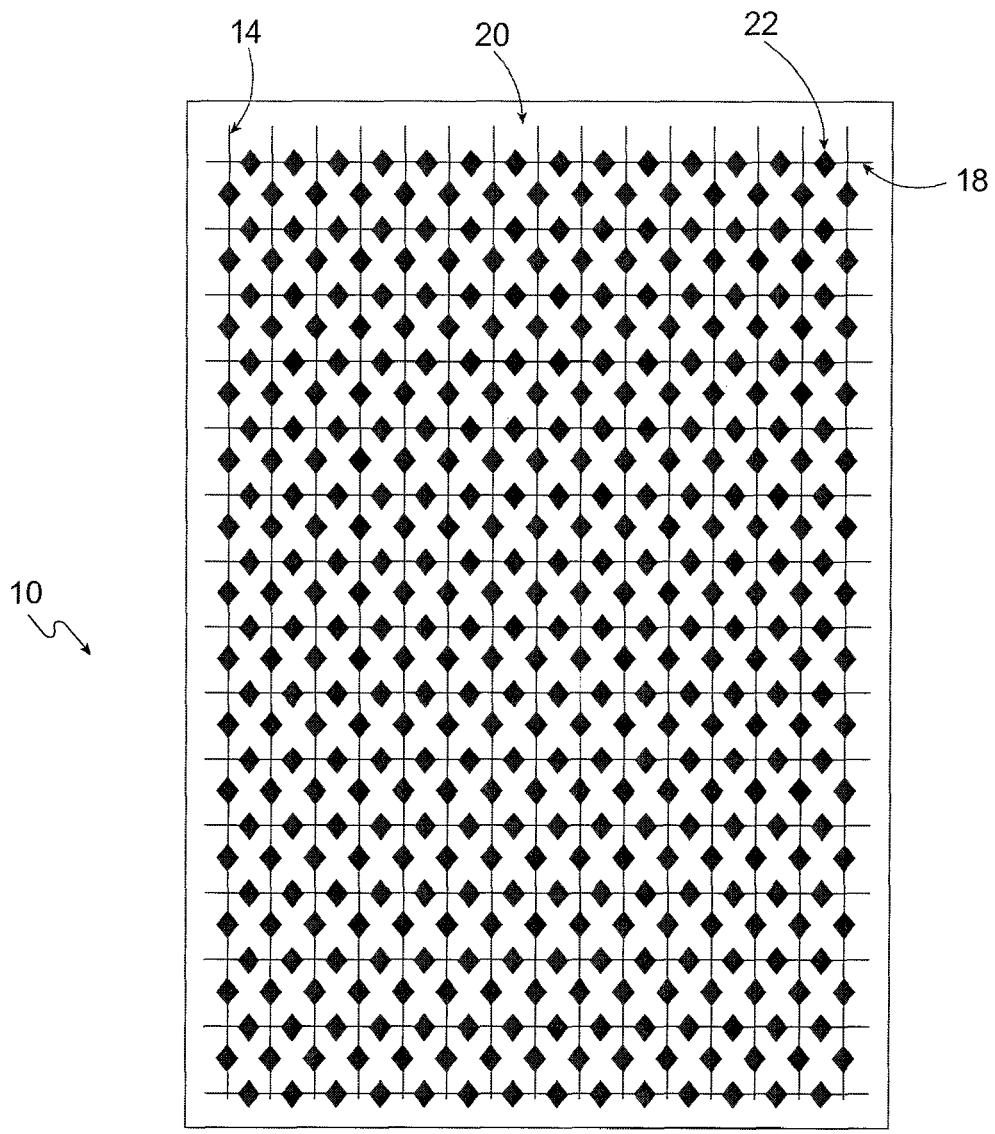
FIG. 5 is a composite view of the object position sensor transducer of FIGS. 3 and 4 showing both the top and bottom conductive trace layers.
Figure 6:
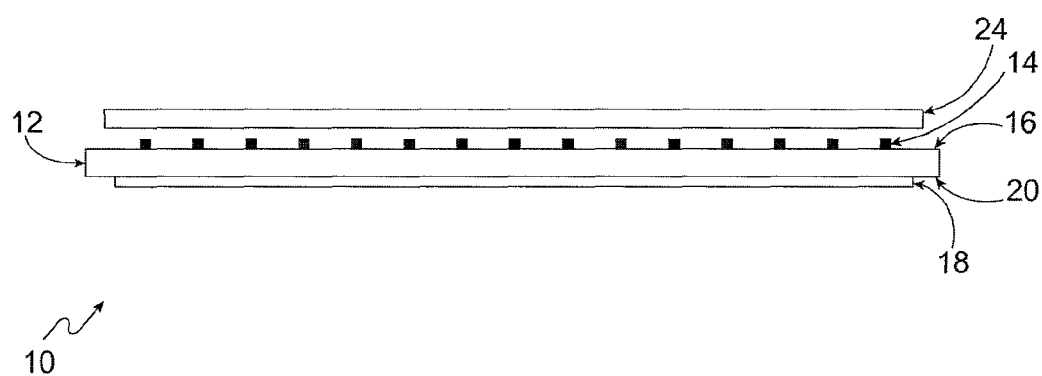
FIG. 6 is a cross-sectional view of the object position sensor transducer of FIGS. 3-5.

FIG. 2 (obtained from U.S. Pat. No. 7,575,040) shows the time-temperature-transformation (TTT) cooling curve of an exemplary bulk solidifying amorphous alloy, or TTT diagram. Bulk-solidifying amorphous metals do not experience a liquid/solid crystallization transformation upon cooling, as with conventional metals. Instead, the highly fluid, non crystalline form of the metal found at high temperatures (near a "melting temperature" Tm) becomes more viscous as the temperature is reduced (near to the glass transition temperature Tg), eventually taking on the outward physical properties of a conventional solid.

Even though there is no liquid/crystallization transformation for a bulk solidifying amorphous metal, a "melting temperature" Tm may be defined as the thermodynamic liquidus temperature of the corresponding crystalline phase. Under this regime, the viscosity of bulk-solidifying amorphous alloys at the melting temperature could lie in the range of about 0.1 poise to about 10,000 poise, and even sometimes under 0.01 poise. A lower viscosity at the "melting temperature" would provide faster and complete filling of intricate portions of the shell/mold with a bulk solidifying amorphous metal for forming the BMG parts. Furthermore, the cooling rate of the molten metal to form a BMG part has to such that the time-temperature profile during cooling does not traverse through the nose-shaped region bounding the crystallized region in the TTT diagram of FIG. 2. In FIG. 2, Tnose is the critical crystallization temperature Tx where crystallization is most rapid and occurs in the shortest time scale.

The supercooled liquid region, the temperature region between Tg and Tx is a manifestation of the extraordinary stability against crystallization of bulk solidification alloys. In this temperature region the bulk solidifying alloy can exist as a high viscous liquid. The viscosity of the bulk solidifying alloy in the supercooled liquid region can vary between $10^{12}$ Pa s at the glass transition temperature down to $10^5$ Pa s at the crystallization temperature, the high temperature limit of the supercooled liquid region. Liquids with such viscosities can undergo substantial plastic strain under an applied pressure. The embodiments herein make use of the large plastic formability in the supercooled liquid region as a forming and separating method.

One needs to clarify something about Tx. Technically, the nose-shaped curve shown in the TTT diagram describes Tx as a function of temperature and time. Thus, regardless of the trajectory that one takes while heating or cooling a metal alloy, when one hits the TTT curve, one has reached Tx. In FIG. 1, Tx is shown as a dashed line as Tx can vary from close to Tm to close to Tg.

The schematic TTT diagram of FIG. 2 shows processing methods of die casting from at or above Tm to below Tg without the time-temperature trajectory (shown as (1) as an example trajectory) hitting the TTT curve. During die casting, the forming takes place substantially simultaneously with fast cooling to avoid the trajectory hitting the TTT curve. The methods for superplastic forming (SPF) from at or below Tg to below Tm without the time-temperature trajectory (shown as (2), (3) and (4) as example trajectories) hitting the TTT curve. In SPF, the amorphous BMG is reheated into the supercooled liquid region where the available processing window could be much larger than die casting, resulting in better controllability of the process. The SPF process does not require fast cooling to avoid crystallization during cooling. Also, as shown by example trajectories (2), (3) and (4), the SPF can be carried out with the highest temperature during SPF being above Tnose or below Tnose, up to about Tm. If one heats up a piece of amorphous alloy but manages to avoid hitting the TTT curve, you have heated "between Tg and Tm", but one would have not reached Tx.

Typical differential scanning calorimeter (DSC) heating curves of bulk-solidifying amorphous alloys taken at a heating rate of 20 C/min describe, for the most part, a particular trajectory across the TTT data where one would likely see a Tg at a certain temperature, a Tx when the DSC heating ramp crosses the TTT crystallization onset, and eventually melting peaks when the same trajectory crosses the temperature range for melting. If one heats a bulk-solidifying amorphous alloy at a rapid heating rate as shown by the ramp up portion of trajectories (2), (3) and (4) in FIG. 2, then one could avoid the TTT curve entirely, and the DSC data would show a glass transition but no Tx upon heating. Another way to think about it is trajectories (2), (3) and (4) can fall anywhere in temperature between the nose of the TTT curve (and even above it) and the Tg line, as long as it does not hit the crystallization curve. That just means that the horizontal plateau in trajectories might get much shorter as one increases the processing temperature.

Phase

The term "phase" herein can refer to one that can be found in a thermodynamic phase diagram. A phase is a region of space (e.g., a thermodynamic system) throughout which all physical properties of a material are essentially uniform. Examples of physical properties include density, index of refraction, chemical composition and lattice periodicity. A simple description of a phase is a region of material that is chemically uniform, physically distinct, and/or mechanically separable. For example, in a system consisting of ice and water in a glass jar, the ice cubes are one phase, the water is a second phase, and the humid air over the water is a third phase. The glass of the jar is another separate phase. A phase can refer to a solid solution, which can be a binary, tertiary, quaternary, or more, solution, or a compound, such as an intermetallic compound. As another example, an amorphous phase is distinct from a crystalline phase.

Metal, Transition Metal, and Non-Metal

The term "metal" refers to an electropositive chemical element. The term "element" in this Specification refers generally to an element that can be found in a Periodic Table. Physically, a metal atom in the ground state contains a partially filled band with an empty state close to an occupied state. The term "transition metal" is any of the metallic elements within Groups 3 to 12 in the Periodic Table that have an incomplete inner electron shell and that serve as transitional links between the most and the least electropositive in a series of elements. Transition metals are characterized by multiple valences, colored compounds, and the ability to form stable complex ions. The term "nonmetal" refers to a chemical element that does not have the capacity to lose electrons and form a positive ion.

Depending on the application, any suitable nonmetal elements, or their combinations, can be used. The alloy (or "alloy composition") can comprise multiple nonmetal elements, such as at least two, at least three, at least four, or more, nonmetal elements. A nonmetal element can be any element that is found in Groups 13-17 in the Periodic Table. For example, a nonmetal element can be any one of F, Cl, Br, I, At, O, S, Se, Te, Po, N, P, As, Sb, Bi, C, Si, Ge, Sn, Pb, and B. Occasionally, a nonmetal element can also refer to certain metalloids (e.g., B, Si, Ge, As, Sb, Te, and Po) in Groups 13-17. In one embodiment, the nonmetal elements can include B, Si, C, P, or combinations thereof. Accordingly, for example, the alloy can comprise a boride, a carbide, or both.

A transition metal element can be any of scandium, titanium, vanadium, chromium, manganese, iron, cobalt, nickel, copper, zinc, yttrium, zirconium, niobium, molybdenum, technetium, ruthenium, rhodium, palladium, silver, cadmium, hafnium, tantalum, tungsten, rhenium, osmium, iridium, platinum, gold, mercury, rutherfordium, dubnium, seaborgium, bohrium, hassium, meitnerium, ununnilium, unununium, and ununbium. In one embodiment, a BMG containing a transition metal element can have at least one of Sc, Y, La, Ac, Ti, Zr, Hf, V, Nb, Ta, Cr, Mo, W, Mn, Tc, Re, Fe, Ru, Os, Co, Rh, Ir, Ni, Pd, Pt, Cu, Ag, Au, Zn, Cd, and Hg. Depending on the application, any suitable transitional metal elements, or their combinations, can be used. The alloy composition can comprise multiple transitional metal elements, such as at least two, at least three, at least four, or more, transitional metal elements.

The presently described alloy or alloy "sample" or "specimen" alloy can have any shape or size. For example, the alloy can have a shape of a particulate, which can have a shape such as spherical, ellipsoid, wire-like, rod-like, sheet-like, flake-like, or an irregular shape. The particulate can have any size. For example, it can have an average diameter of between about 1 micron and about 100 microns, such as between about 5 microns and about 80 microns, such as between about 10 microns and about 60 microns, such as between about 15 microns and about 50 microns, such as between about 15 microns and about 45 microns, such as between about 20 microns and about 40 microns, such as between about 25 microns and about 35 microns. For example, in one embodiment, the average diameter of the particulate is between about 25 microns and about 44 microns. In some embodiments, smaller particulates, such as those in the nanometer range, or larger particulates, such as those bigger than 100 microns, can be used.

The alloy sample or specimen can also be of a much larger dimension. For example, it can be a bulk structural component, such as an ingot, housing/casing of an electronic device or even a portion of a structural component that has dimensions in the millimeter, centimeter, or meter range. In a preferred embodiment, the bulk-solidifying alloy is in the form of a substrate, having a rectangular or square shape, and of suitable thickness for use in an electronic device, suitable from about 1 mil to about 1,000 mil thick.

Solid Solution

The term "solid solution" refers to a solid form of a solution. The term "solution" refers to a mixture of two or more substances, which may be solids, liquids, gases, or a combination of these. The mixture can be homogeneous or heterogeneous. The term "mixture" is a composition of two or more substances that are combined with each other and are generally capable of being separated. Generally, the two or more substances are not chemically combined with each other.

Alloy

In some embodiments, the alloy composition described herein can be fully alloyed. In one embodiment, an "alloy" refers to a homogeneous mixture or solid solution of two or more metals, the atoms of one replacing or occupying interstitial positions between the atoms of the other; for example, brass is an alloy of zinc and copper. An alloy, in contrast to a composite, can refer to a partial or complete solid solution of one or more elements in a metal matrix, such as one or more compounds in a metallic matrix. The term alloy herein can refer to both a complete solid solution alloy that can give single solid phase microstructure and a partial solution that can give two or more phases. An alloy composition described herein can refer to one comprising an alloy or one comprising an alloy-containing composite.

Thus, a fully alloyed alloy can have a homogenous distribution of the constituents, be it a solid solution phase, a compound phase, or both. The term "fully alloyed" used herein can account for minor variations within the error tolerance. For example, it can refer to at least 90% alloyed, such as at least 95% alloyed, such as at least 99% alloyed, such as at least 99.5% alloyed, such as at least 99.9% alloyed. The percentage herein can refer to either volume percent or weight percentage, depending on the context. These percentages can be balanced by impurities, which can be in terms of composition or phases that are not a part of the alloy.

Amorphous or Non-Crystalline Solid

An "amorphous" or "non-crystalline solid" is a solid that lacks lattice periodicity, which is characteristic of a crystal. As used herein, an "amorphous solid" includes "glass" which is an amorphous solid that softens and transforms into a liquid-like state upon heating through the glass transition. Generally, amorphous materials lack the long-range order characteristic of a crystal, though they can possess some short-range order at the atomic length scale due to the nature of chemical bonding. The distinction between amorphous solids and crystalline solids can be made based on lattice periodicity as determined by structural characterization techniques such as x-ray diffraction and transmission electron microscopy.

The terms "order" and "disorder" designate the presence or absence of some symmetry or correlation in a many-particle system. The terms "long-range order" and "short-range order" distinguish order in materials based on length scales.

The strictest form of order in a solid is lattice periodicity: a certain pattern (the arrangement of atoms in a unit cell) is repeated again and again to form a translationally invariant tiling of space. This is the defining property of a crystal. Possible symmetries have been classified in 14 Bravais lattices and 230 space groups.

Lattice periodicity implies long-range order. If only one unit cell is known, then by virtue of the translational symmetry it is possible to accurately predict all atomic positions at arbitrary distances. The converse is generally true, except, for example, in quasi-crystals that have perfectly deterministic tilings but do not possess lattice periodicity.

Long-range order characterizes physical systems in which remote portions of the same sample exhibit correlated behavior. This can be expressed as a correlation function, namely the spin-spin correlation function: $G(x,x')=\langle s(x),s(x')\rangle$.

In the above function, s is the spin quantum number and x is the distance function within the particular system. This function is equal to unity when $x=x'$ and decreases as the distance $|x-x'|$ increases. Typically, it decays exponentially to zero at large distances, and the system is considered to be disordered. If, however, the correlation function decays to a constant value at large $|x-x'|$, then the system can be said to possess long-range order. If it decays to zero as a power of the distance, then it can be called quasi-long-range order. Note that what constitutes a large value of $|x-x'|$ is relative.

A system can be said to present quenched disorder when some parameters defining its behavior are random variables that do not evolve with time (i.e., they are quenched or frozen)—e.g., spin glasses. It is opposite to annealed disorder, where the random variables are allowed to evolve themselves. Embodiments herein include systems comprising quenched disorder.

The alloy described herein can be crystalline, partially crystalline, amorphous, or substantially amorphous. For example, the alloy sample/specimen can include at least some crystallinity, with grains/crystals having sizes in the nanometer and/or micrometer ranges. Alternatively, the alloy can be substantially amorphous, such as fully amorphous. It is preferred that the alloy be substantially amorphous, and then be processed in accordance with the preferred method to provide discrete areas of crystallinity, and discrete areas of amorphous alloy.

In one embodiment, the presence of a crystal or a plurality of crystals in an otherwise amorphous alloy can be construed as a "crystalline phase" therein. The degree of crystallinity (or "crystallinity" for short in some embodiments) of an alloy can refer to the amount of the crystalline phase present in the alloy. The degree can refer to, for example, a fraction of crystals present in the alloy. The fraction can refer to volume fraction or weight fraction, depending on the context. A measure of how "amorphous" an amorphous alloy is can be amorphicity. Amorphicity can be measured in terms of a degree of crystallinity. For example, in one embodiment, an alloy having a low degree of crystallinity can be said to have a high degree of amorphicity. In one embodiment, for example, an alloy having 60 vol % crystalline phase can have a 40 vol % amorphous phase.

Amorphous Alloy or Amorphous Metal

An "amorphous alloy" is an alloy having an amorphous content of more than 50% by volume, preferably more than 90% by volume of amorphous content, more preferably more than 95% by volume of amorphous content, and most preferably more than 99% to almost 100% by volume of amorphous content. Note that, as described above, an alloy high in amorphicity is equivalently low in degree of crystallinity. An "amorphous metal" is an amorphous metal material with a disordered atomic-scale structure. In contrast to most metals, which are crystalline and therefore have a highly ordered arrangement of atoms, amorphous alloys are non-crystalline. Materials in which such a disordered structure is produced directly from the liquid state during cooling are sometimes referred to as "glasses." Accordingly, amorphous metals are commonly referred to as "metallic glasses" or "glassy metals." In one embodiment, a bulk metallic glass ("BMG") can refer to an alloy, of which the microstructure is at least partially amorphous. However, there are several ways besides extremely rapid cooling to produce amorphous metals, including physical vapor deposition, solid-state reaction, ion irradiation, melt spinning, and mechanical alloying. Amorphous alloys can be a single class of materials, regardless of how they are prepared.

Amorphous metals can be produced through a variety of quick-cooling methods. For instance, amorphous metals can be produced by sputtering molten metal onto a spinning metal disk. The rapid cooling, on the order of millions of degrees a second, can be too fast for crystals to form, and the material is thus "locked in" a glassy state. Also, amorphous metals/alloys can be produced with critical cooling rates low enough to allow formation of amorphous structures in thick layers—e.g., bulk metallic glasses.

The terms "bulk metallic glass" ("BMG"), bulk amorphous alloy ("BAA"), and bulk solidifying amorphous alloy are used interchangeably herein. They refer to amorphous alloys having the smallest dimension at least in the millimeter range. For example, the dimension can be at least about 0.5 mm, such as at least about 1 mm, such as at least about 2 mm, such as at least about 4 mm, such as at least about 5 mm, such as at least about 6 mm, such as at least about 8 mm, such as at least about 10 mm, such as at least about 12 mm. Depending on the geometry, the dimension can refer to the diameter, radius, thickness, width, length, etc. A BMG can also be a metallic glass having at least one dimension in the centimeter range, such as at least about 1.0 cm, such as at least about 2.0 cm, such as at least about 5.0 cm, such as at least about 10.0 cm. In some embodiments, a BMG can have at least one dimension at least in the meter range. A BMG can take any of the shapes or forms described above, as related to a metallic glass. Accordingly, a BMG described herein in some embodiments can be different from a thin film made by a conventional deposition technique in one important aspect—the former can be of a much larger dimension than the latter.

Amorphous metals can be an alloy rather than a pure metal. The alloys may contain atoms of significantly different sizes, leading to low free volume (and therefore having viscosity up to orders of magnitude higher than other metals and alloys) in a molten state. The viscosity prevents the atoms from moving enough to form an ordered lattice. The material structure may result in low shrinkage during cooling and resistance to plastic deformation. The absence of grain boundaries, the weak spots of crystalline materials in some cases, may, for example, lead to better resistance to wear and corrosion. In one embodiment, amorphous metals, while technically glasses, may also be much tougher and less brittle than oxide glasses and ceramics.

Thermal conductivity of amorphous materials may be lower than that of their crystalline counterparts. To achieve formation of an amorphous structure even during slower cooling, the alloy may be made of three or more components, leading to complex crystal units with higher potential energy and lower probability of formation. The formation of amorphous alloy can depend on several factors: the composition of the components of the alloy; the atomic radius of the components (preferably with a significant difference of over 12% to achieve high packing density and low free volume); and the negative heat of mixing the combination of components, inhibiting crystal nucleation and prolonging the time the molten metal stays in a supercooled state. However, as the formation of an amorphous alloy is based on many different variables, it can be difficult to make a prior determination of whether an alloy composition would form an amorphous alloy.

Amorphous alloys, for example, of boron, silicon, phosphorus, and other glass formers with magnetic metals (iron, cobalt, nickel) may be magnetic, with low coercivity and high electrical resistance. The high resistance leads to low losses by eddy currents when subjected to alternating magnetic fields, a property useful, for example, as transformer magnetic cores.

Amorphous alloys may have a variety of potentially useful properties. In particular, they tend to be stronger than crystalline alloys of similar chemical composition, and they can sustain larger reversible ("elastic") deformations than crystalline alloys. Amorphous metals derive their strength directly from their non-crystalline structure, which can have none of the defects (such as dislocations) that limit the strength of crystalline alloys. For example, one modern amorphous metal, known as Vitreloy™, has a tensile strength that is almost twice that of high-grade titanium. In some embodiments, metallic glasses at room temperature are not ductile and tend to fail suddenly when loaded in tension, which limits the material applicability in reliability-critical applications, as the impending failure is not evident. Therefore, to overcome this challenge, metal matrix composite materials having a metallic glass matrix containing dendritic particles or fibers of a ductile crystalline metal can be used. Alternatively, a BMG low in element(s) that tend to cause embitterment (e.g., Ni) can be used. For example, a Ni-free BMG can be used to improve the ductility of the BMG.

Another useful property of bulk amorphous alloys is that they can be true glasses; in other words, they can soften and flow upon heating. This can allow for easy processing, such as by injection molding, in much the same way as polymers. As a result, amorphous alloys can be used for making sports equipment, medical devices, electronic components and equipment, and thin films Thin films of amorphous metals can be deposited as protective coatings via a high velocity oxygen fuel technique. The amorphous metal alloy also can be processed to form a thin-film-like substrate having a conducting wire positioned therein or on a surface thereof, and that can be further processed to have discrete areas of crystallinity, as described herein.

A material can have an amorphous phase, a crystalline phase, or both. The amorphous and crystalline phases can have the same chemical composition and differ only in the microstructure—i.e., one amorphous and the other crystalline. Microstructure in one embodiment refers to the structure of a material as revealed by a microscope at 25× magnification or higher. Alternatively, the two phases can have different chemical compositions and microstructures. For example, a composition can be partially amorphous, substantially amorphous, or completely amorphous.

As described above, the degree of amorphicity (and conversely the degree of crystallinity) can be measured by fraction of crystals present in the alloy. The degree can refer to volume fraction of weight fraction of the crystalline phase present in the alloy. A partially amorphous composition can refer to a composition of at least about 5 vol % of which is of an amorphous phase, such as at least about 10 vol %, such as at least about 20 vol %, such as at least about 40 vol %, such as at least about 60 vol %, such as at least about 80 vol %, such as at least about 90 vol %. The terms "substantially" and "about" have been defined elsewhere in this application. Accordingly, a composition that is at least substantially amorphous can refer to one of which at least about 90 vol % is amorphous, such as at least about 95 vol %, such as at least about 98 vol %, such as at least about 99 vol %, such as at least about 99.5 vol %, such as at least about 99.8 vol %, such as at least about 99.9 vol %. In one embodiment, a substantially amorphous composition can have some incidental, insignificant amount of crystalline phase present therein.

In one embodiment, an amorphous alloy composition can be homogeneous with respect to the amorphous phase. A substance that is uniform in composition is homogeneous. This is in contrast to a substance that is heterogeneous. The term "composition" refers to the chemical composition and/or microstructure in the substance. A substance is homogeneous when a volume of the substance is divided in half and both halves have substantially the same composition. For example, a particulate suspension is homogeneous when a volume of the particulate suspension is divided in half and both halves have substantially the same volume of particles. However, it might be possible to see the individual particles under a microscope. Another example of a homogeneous substance is air where different ingredients therein are equally suspended, though the particles, gases and liquids in air can be analyzed separately or separated from air.

A composition that is homogeneous with respect to an amorphous alloy can refer to one having an amorphous phase substantially uniformly distributed throughout its microstructure. In other words, the composition macroscopically comprises a substantially uniformly distributed amorphous alloy throughout the composition. In an alternative embodiment, the composition can be of a composite, having an amorphous phase having therein a non-amorphous phase. The non-amorphous phase can be a crystal or a plurality of crystals. The crystals can be in the form of particulates of any shape, such as spherical, ellipsoid, wire-like, rod-like, sheet-like, flake-like, or an irregular shape. In one embodiment, it can have a dendritic form. For example, an at least partially amorphous composite composition can have a crystalline phase in the shape of dendrites dispersed in an amorphous phase matrix; the dispersion can be uniform or non-uniform, and the amorphous phase and the crystalline phase can have the same or a different chemical composition. In one embodiment, they have substantially the same chemical composition. In another embodiment, the crystalline phase can be more ductile than the BMG phase.

The methods described herein can be applicable to any type of amorphous alloy. Similarly, the amorphous alloy described herein as a constituent of a composition or article can be of any type. The amorphous alloy can comprise the element Zr, Hf, Ti, Cu, Ni, Pt, Pd, Fe, Mg, Au, La, Ag, Al, Mo, Nb, Be, or combinations thereof. Namely, the alloy can include any combination of these elements in its chemical formula or chemical composition. The elements can be present at different weight or volume percentages. For example, an iron "based" alloy can refer to an alloy having a non-insignificant weight percentage of iron present therein, the weight percent can be, for example, at least about 20 wt %, such as at least about 40 wt %, such as at least about 50 wt %, such as at least about 60 wt %, such as at least about 80 wt %. Alternatively, in one embodiment, the above-described percentages can be volume percentages, instead of weight percentages. Accordingly, an amorphous alloy can be zirconium-based, titanium-based, platinum-based, palladium-based, gold-based, silver-based, copper-based, iron-based, nickel-based, aluminum-based, molybdenum-based, and the like. The alloy can also be free of any of the aforementioned elements to suit a particular purpose. For example, in some embodiments, the alloy, or the composition including the alloy, can be substantially free of nickel, aluminum, titanium, beryllium, or combinations thereof. In one embodiment, the alloy or the composite is completely free of nickel, aluminum, titanium, beryllium, or combinations thereof.

For example, the amorphous alloy can have the formula $(Zr, Ti)_a(Ni, Cu, Fe)_b(Be, Al, Si, B)_c$, wherein a, b, and c each represents a weight or atomic percentage. In one embodiment, a is in the range of from 30 to 75, b is in the range of from 5 to 60, and c is in the range of from 0 to 50 in atomic percentages. Alternatively, the amorphous alloy can have the formula $(Zr, Ti)_a(Ni, Cu)_b(Be)_c$, wherein a, b, and c each represents a weight or atomic percentage. In one embodiment, a is in the range of from 40 to 75, b is in the range of from 5 to 50, and c is in the range of from 5 to 50 in atomic percentages. The alloy can also have the formula $(Zr, Ti)_a(Ni, Cu)_b(Be)_c$, wherein a, b, and c each represents a weight or atomic percentage. In one embodiment, a is in the range of from 45 to 65, b is in the range of from 7.5 to 35, and c is in the range of from 10 to 37.5 in atomic percentages. Alternatively, the alloy can have the formula $(Zr)_a(Nb, Ti)_b(Ni, Cu)_c(Al)_d$, wherein a, b, c, and d each represents a weight or atomic percentage. In one embodiment, a is in the range of from 45 to 65, b is in the range of from 0 to 10, c is in the range of from 20 to 40 and d is in the range of from 7.5 to 15 in atomic percentages. One exemplary embodiment of the aforedescribed alloy system is a Zr—Ti—Ni—Cu—Be based amorphous alloy under the trade name Vitreloy™, such as Vitreloy-1 and Vitreloy-101, as fabricated by Liquidmetal Technologies, CA, USA. Some examples of amorphous alloys of the different systems are provided in Table 1.

The amorphous alloys can also be ferrous alloys, such as (Fe, Ni, Co) based alloys. Examples of such compositions are disclosed in U.S. Pat. Nos. 6,325,868; 5,288,344; 5,368,659; 5,618,359; and 5,735,975, Inoue et al., Appl. Phys. Lett., Volume 71, p 464 (1997), Shen et al., Mater. Trans., JIM, Volume 42, p 2136 (2001), and Japanese Patent Application No. 200126277 (Pub. No. 2001303218 A). One exemplary composition is $Fe_{72}Al_5Ga_2P_{11}C_6B_4$. Another example is $Fe_{72}Al_7Zr_{10}Mo_5W_2B_{15}$. Another iron-based alloy system that can be used in the coating herein is disclosed in U.S. Patent Application Publication No. 2010/0084052, wherein the amorphous metal contains, for example, manganese (1 to 3 atomic %), yttrium (0.1 to 10 atomic %), and silicon (0.3 to 3.1 atomic %) in the range of composition given in parentheses; and that contains the following elements in the specified range of composition given in parentheses: chromium (15 to 20 atomic %), molybdenum (2 to 15 atomic %), tungsten (1 to 3 atomic %), boron (5 to 16 atomic %), carbon (3 to 16 atomic %), and the balance iron.

The aforedescribed amorphous alloy systems can further include additional elements, such as additional transition metal elements, including Nb, Cr, V, and Co. The additional elements can be present at less than or equal to about 30 wt %, such as less than or equal to about 20 wt %, such as less than or equal to about 10 wt %, such as less than or equal to about 5 wt %. In one embodiment, the additional, optional element is at least one of cobalt, manganese, zirconium, tantalum, niobium, tungsten, yttrium, titanium, vanadium and hafnium to form carbides and further improve wear and corrosion resistance. Further optional elements may include phosphorous, germanium and arsenic, totaling up to about 2%, and preferably less than 1%, to reduce melting point. Otherwise incidental impurities should be less than about 2% and preferably 0.5%.

TABLE 1

Exemplary amorphous alloy compositions

| Alloy | Atm % | Atm % | Atm % | Atm % | Atm % | Atm % |
|---|---|---|---|---|---|---|
| 1 | Zr 41.20% | Ti 13.80% | Cu 12.50% | Ni 10.00% | Be 22.50% | |
| 2 | Zr 44.00% | Ti 11.00% | Cu 10.00% | Ni 10.00% | Be 25.00% | |
| 3 | Zr 56.25% | Ti 11.25% | Cu 6.88% | Ni 5.63% | Nb 7.50% | Be 12.50% |
| 4 | Zr 64.75% | Ti 5.60% | Cu 14.90% | Ni 11.15% | Al 2.60% | Be 1.00% |
| 5 | Zr 52.50% | Ti 5.00% | Cu 17.90% | Ni 14.60% | Al 10.00% | |
| 6 | Zr 57.00% | Nb 5.00% | Cu 15.40% | Ni 12.60% | Al 10.00% | |
| 7 | Zr 50.75% | Cu 36.23% | Ni 4.03% | Al 9.00% | Sn 0.50% | |
| 8 | Zr 46.75% | Ti 8.25% | Cu 7.50% | Ni 10.00% | Be 27.50% | |
| 9 | Zr 21.67% | Ti 43.33% | Ni 7.50% | Be 27.50% | | |
| 10 | Zr 35.00% | Ti 30.00% | Cu 7.50% | Be 27.50% | | |
| 11 | Zr 35.00% | Ti 30.00% | Co 6.00% | Be 29.00% | | |
| 12 | Au 49.00% | Ag 5.50% | Pd 2.30% | Cu 26.90% | Si 16.30% | |
| 13 | Au 50.90% | Ag 3.00% | Pd 2.30% | Cu 27.80% | Si 16.00% | |
| 14 | Pt 57.50% | Cu 14.70% | Ni 5.30% | P 22.50% | | |
| 15 | Zr 36.60% | Ti 31.40% | Nb 7.00% | Cu 5.90% | Be 19.10% | |
| 16 | Zr 38.30% | Ti 32.90% | Nb 7.30% | Cu 6.20% | Be 15.30% | |
| 17 | Zr 39.60% | Ti 33.90% | Nb 7.60% | Cu 6.40% | Be 12.50% | |
| 18 | Cu 47.00% | Ti 34.00% | Zr 11.00% | Ni 8.00% | | |
| 19 | Zr 55.00% | Co 25.00% | Al 20.00% | | | |

Other exemplary ferrous metal-based alloys include compositions such as those disclosed in U.S. Patent Application Publication Nos. 2007/0079907 and 2008/0118387. These compositions include the Fe(Mn, Co, Ni, Cu) (C, Si, B, P, Al) system, wherein the Fe content is from 60 to 75 atomic percentage, the total of (Mn, Co, Ni, Cu) is in the range of from 5 to 25 atomic percentage, and the total of (C, Si, B, P, Al) is in the range of from 8 to 20 atomic percentage, as well as the exemplary composition Fe48Cr15Mo14Y2C15B6. They also include the alloy systems described by Fe—Cr—Mo—(Y,Ln)-C—B, Co—Cr—Mo-Ln-C—B, Fe—Mn—Cr—Mo—(Y,Ln)-C—B, (Fe, Cr, Co)—(Mo,Mn)—(C,B)—Y, Fe—(Co,Ni)—(Zr,Nb,Ta)—(Mo,W)—B, Fe—(Al,Ga)—(P,C,B,Si,Ge), Fe—(Co, Cr,Mo,Ga,Sb)—P—B—C, (Fe, Co)—B—Si—Nb alloys, and Fe—(Cr—Mo)—(C,B)—Tm, where Ln denotes a lanthanide element and Tm denotes a transition metal element. Furthermore, the amorphous alloy can also be one of the exemplary compositions Fe80P12.5C5B2.5, Fe80P11C5B2.5Si1.5, Fe74.5Mo5.5P12.5C5B2.5, Fe74.5Mo5.5P11C5B2.5Si1.5, Fe70Mo5Ni5P12.5C5B2.5, Fe70Mo5Ni5P11C5B2.5Si1.5, Fe68Mo5Ni5Cr2P12.5C5B2.5, and Fe68Mo5Ni5Cr2P11C5B2.5Si1.5, described in U.S. Patent Application Publication No. 2010/0300148. Some additional examples of amorphous alloys of different systems are provided in Table 2.

TABLE 2

Exemplary amorphous alloy compositions

| Alloy | Atm % | Atm % | Atm % | Atm % | Atm % | Atm % | Atm % |
|---|---|---|---|---|---|---|---|
| 1 | Fe 68.00% | Mo 5.00% | Ni 5.00% | Cr 2.00% | P 12.50% | C 5.00% | B 2.50% |
| 2 | Fe 68.00% | Mo 5.00% | Ni 5.00% | Cr 2.00% | P 11.00% | C 5.00% | B 2.50% | Si 1.50% |
| 3 | Pd 44.48% | Cu 32.35% | Co 4.05% | P 19.11% | | | |
| 4 | Pd 77.50% | Ag 6.00% | Si 9.00% | P 7.50% | | | |
| 5 | Pd 79.00% | Ag 3.50% | Si 9.50% | P 6.00% | Ge 2.00% | | |
| 5 | Pt 74.70% | Cu 1.50% | Ag 0.30% | P 18.0% | B 4.00% | Si 1.50% | |

In some embodiments, a composition having an amorphous alloy can include a small amount of impurities. The impurity elements can be intentionally added to modify the properties of the composition, such as improving the mechanical properties (e.g., hardness, strength, fracture mechanism, etc.) and/or improving the corrosion resistance. Alternatively, the impurities can be present as inevitable, incidental impurities, such as those obtained as a byproduct of processing and manufacturing. The impurities can be less than or equal to about 10 wt %, such as about 5 wt %, such as about 2 wt %, such as about 1 wt %, such as about 0.5 wt %, such as about 0.1 wt %. In some embodiments, these percentages can be volume percentages instead of weight percentages. In one embodiment, the alloy sample/composition consists essentially of the amorphous alloy (with only a small incidental amount of impurities). In another embodiment, the composition includes the amorphous alloy (with no observable trace of impurities).

In embodiments herein, the existence of a supercooled liquid region in which the bulk-solidifying amorphous alloy can exist as a high viscous liquid allows for superplastic forming. Large plastic deformations can be obtained. The ability to undergo large plastic deformation in the supercooled liquid region is used for the forming and/or cutting process. As opposed to solids, the liquid bulk solidifying alloy deforms locally which drastically lowers the required energy for cutting and forming. The ease of cutting and forming depends on the temperature of the alloy, the mold, and the cutting tool. The higher the temperature, the lower the viscosity, and consequently, higher temperatures lead to easier cutting and forming. An advantage of using such a bulk-solidifying amorphous alloy as a substrate is that the substrate need not be linear, but may have a spherical or dome shape. Such a shaped substrate enables the fabrication of different shaped touch sensors that may provide for a more ergonomic sensor, for example, one grasped by a user's hand.

Embodiments herein can utilize a thermoplastic-forming process with amorphous alloys carried out between Tg and Tx, for example. Herein, Tx and Tg are determined from standard DSC measurements at typical heating rates (e.g. 20° C./min) as the onset of crystallization temperature and the onset of glass transition temperature.

The amorphous alloy components can have the critical casting thickness and the final part can have thickness that is thicker than the critical casting thickness. Moreover, the time and temperature of the heating and shaping operation is selected such that the elastic strain limit of the amorphous alloy could be substantially preserved to be not less than 1.0%, and preferably not being less than 1.5%. In the context of the embodiments herein, temperatures around glass transition means the forming temperatures can be below glass transition, at or around glass transition, and above glass transition temperature, but preferably at temperatures below the crystallization temperature $T_x$. The cooling step is carried out at rates similar to the heating rates at the heating step, and preferably at rates greater than the heating rates at the heating step. The cooling step is also achieved preferably while the forming and shaping loads are still maintained.

Electronic Devices

The embodiments herein can be valuable in the fabrication of touch sensors for use in electronic devices using a BMG. An electronic device herein can refer to any electronic device known in the art. For example, it can be a telephone, such as a cell phone, and a land-line phone, or any communication device, such as a smart phone, including, for example an iPhone™, and an electronic email sending/receiving device. It can be a part of a display, such as a digital display, a TV monitor, an electronic-book reader, a portable web-browser (e.g., iPad™), and a computer monitor. It can also be used as part of the display of an entertainment device, including a portable DVD player, conventional DVD player, Blue-Ray disk player, video game console, music player, such as a portable music player (e.g., iPod™), etc. It can also be a part of a device that provides control, such as controlling the streaming of images, videos, sounds (e.g., Apple TV™), or it can be a remote control for an electronic device. The sensors also can be used in display devices for use in other devices, such as a watch or a clock.

Embodiments of Touch Interface

The preferred embodiments include a bulk-solidifying amorphous alloy as a substrate, and then forming on that substrate a plurality of discrete areas of crystallinity on at least one of the upper or lower surfaces of the substrate. The substrate also will have positioned therein at least one conducting wire that is in electrically connection with the discrete areas of crystallinity, thereby providing discrete areas on at least one surface of the substrate of electrically conductivity. Use of such a bulk-solidifying amorphous alloy as the substrate, instead of conventional silicon-based materials, enables greater positional control of the discrete areas, provides for the ability to create more densely packed arrays, thereby providing for greater precision in detecting the sensed position. The substrate may be useful in forming capacitive touch sensors useful in object position detectors, touch sensors in which the sense and drive lines are on the same surface of the substrate, and integrated touch sensors in which the discrete areas of crystallinity are multi-function circuit elements that can operate as circuitry of the display system (e.g., in the case of LCD displays), as well as forming a part of the touch sensing system that senses one or more touches on or near the display. These and other embodiments will be described in more detail with reference to the figures.

The present embodiments combine a number of unique features that allow for new applications not before possible. Because the touch sensor has very low power requirements, it is beneficial for use in battery operated or low power applications such as lap top, portable computers, and PDAs. It also is a relatively low cost solution, has no moving parts (and is therefore virtually maintenance free), and uses existing printed circuit board traces for sensors. The sensing technology can be integrated into a computer motherboard to even further lower its cost in computer applications. Similarly, in other applications the sensor can be part of an already existing circuit board.

Because of its small size and low profile, the sensor is useful in lap top or hand-held portable applications where volume is an important consideration. The sensor requires circuit board space for only a single sensor interface chip that can interface directly to a microprocessor, plus the area needed on the printed circuit board for sensing. Moreover, in embodiments in which the touch sensor includes multi-function elements that can operate as circuitry for the display system, as well as for the touch sensing system, the embodiments can greatly reduce the size required for the component parts.

The substrate material of the embodiments is fabricated from a bulk-solidifying amorphous alloy material. This material can be formed into any size and shape, depending on the ultimate use of the sensor (e.g., hand-held device, mobile phone, lap top computer, electronic device such as a remote or audio-visual equipment, automobile navigation and display systems, and the like), and can be formed to either permit the passage of conductive wires, or printed circuit board tracers, or they can be formed integral with the substrate. Because of the unique nature of the bulk-solidifying amorphous alloy, the substrate can be processed to provide extremely small discrete areas of crystallinity that permits the creation of a conductive X/Y matrix of pads. This renders the sensor useful as well in any portable equipment application or in human interface where the sensor needs to be molded to fit within the hand.

While small sensor areas are practical, i.e., a presently conceived embodiment takes about 1.5"×1.5" of area for a touch pad, those of ordinary skill in the art will recognize that the area is scalable for different applications, such as for use in larger touch sensitive displays on a television, a portable device, a mobile phone, and the like. The matrix area is scaleable by either varying the matrix trace spacing or by varying the number of traces. Large sensor areas are practical where more information is needed. Besides simple X and Y position information, the sensor technology may also provides finger pressure information, as described, for example, in U.S. Pat. No. 5,648,642, the disclosure of which is incorporated by reference herein in its entirety. This additional dimension of information may be used by programs to control special features such as "brush-width" modes in Paint programs, special menu accesses, etc., allowing provision of a more natural sensory input to computers.

The sensor of the present embodiments preferably makes use of a transducer device capable of providing position and optionally, pressure information regarding the object contacting the transducer. Referring first to FIGS. 3-6, top, bottom, composite, and cross-sectional views, respectively, are shown of a touch sensor array for use in the embodiments. Since capacitance is exploited by this embodiment, the sensor surface is designed to maximize the capacitive coupling between top (X) trace pads to the bottom (Y) trace pads in a way that can be maximally perturbed and coupled to a finger or other object placed above the surface.

A presently preferred sensor array 10 according to the embodiments comprises a substrate 12 comprised of a bulk-solidifying amorphous alloy including a set of first conductive traces 14 positioned on a top surface 16 thereof and run in a first direction to comprise rows of the sensor array 10. A set of second conductive traces 18 may be positioned on a bottom surface 20 thereof and run in a second direction preferably orthogonal to the first direction to form the columns of the sensor array 10. The sets of first and second conductive traces 14 and 18 are alternately in contact with periodic sense pads 22 comprising enlarged areas, shown as diamonds in FIGS. 3-5. While sense pads 22 are shown as diamonds in FIGS. 3-5, any shape, such as circles, which allows close packing of the sense pads 22, can be employed.

Sense pads 22 are comprised of discrete areas of crystalline alloy having the same composition as the bulk-solidifying amorphous alloy forming the substrate 12. Traces 14 and 18 preferably are conductive wires that are in electrical contact with sense pads 12 either by printing on the surface in which sense pads exist (as shown for example in FIG. 7), or by positioning traces 14 and 18 within the body of substrate 12. The traces 14 and 18 can make electrical contact with sense pads 22 by virtue of the crystalline nature of the alloy, which is a much greater conductor of electrical signals or impulses than the surrounding amorphous alloy 26, which preferably does not conduct electrical signals, or has sufficient resistance to the magnitude of the electrical signal or impulse generated by the system to conduct an electrical signal.

The number and spacing of these sense pads 22 depends upon the resolution desired. For example, in an embodiment, a 0.25 cm center-to-center diamond-shaped pattern of sense pads disposed along a matrix of 15 rows and 15 columns of conductors may be employed. Every other sense pad 22 in each direction in the pad pattern is connected to sets of first and second conductive traces 14 and 18 on the top and bottom surfaces 16 and 20, respectively of substrate 12. The bulk-solidifying amorphous alloy used as substrate 12 enables the manufacture of very discrete sense pads 22, providing for a much more dense pattern of sense pads, thereby improving the resolution of the sensor. For example, another embodiment provides for center-to-center spacing of as little as 0.1 mm, although typically the spacing will be on the order of 1 mm.

The thickness of bulk-solidifying amorphous alloy substrate 12 is unimportant as long as contact may be made therethrough from the set of second conductive traces 18 to their sense pads 22 on the top surface 16. Pad-to-pad spacing should preferably be minimized to something in the range of about 15 mils or less. Connections from the sense pads 22 to the set of second traces 18 may be made employing standard plated-through hole techniques well known in the printed circuit board art. Preferably, connections are made by virtue of the electrically conductive nature of the crystallinity of the sense pads 22 brought about by selectively heating the bulk-solidifying amorphous alloy substrate 12 in the area where sense pads 22 will be formed, and allowing the heated alloy at those selected positions to cool in a manner, as shown in FIG. 2, such that the alloy forms a crystal structure within the crystallization region. The traces 18 can be positioned within substrate, or on one or the other surface of substrate 12 such that electrical connection is made between sense pads 22 and trace 18. It is important to recognize that traces 18 need not make direct contact with sense pads 22 due to the crystalline structure of sense pads 22, which crystallinity may extend partially or throughout the entire thickness of substrate 12. In one embodiment, the sense pads 22 are formed so that a crystal structure is present throughout the entire thickness of the substrate 12, thereby enabling the use of a tracer 18 on the opposite surface of the substrate 12 from sense pads 22. In another embodiment, sense pads 22 are formed so that a crystal structure is present only partially through the thickness of the substrate 12, in which case tracers 18 will be positioned within the substrate. In yet another embodiment, traces 18 are in direct contact with sense pads by employing standard through holes in substrate 12, which can be made using conventional techniques.

An insulating layer 24 (FIG. 6) may optionally be positioned over the sense pads 22 on top surface 16 to insulate a human finger or other object therefrom. Insulating layer 24 is preferably a thin layer (i.e., approximately 5 mils) to keep capacitive coupling large and may comprise a material, such as mylar, chosen for its protective and ergonomic characteristics.

There are two different capacitive effects taking place when a finger approaches the sensor array 10. The first capacitive effect is trans-capacitance, or coupling between sense pads 22, and the second capacitive effect is self-capacitance (ground capacitance), or coupling to earth-ground. Sensing circuitry is coupled to the sensor array 10 of the present invention and responds to changes in either or both of these capacitances. It is believed that the relative sizes of the two capacitances change greatly depends on the user environment. The ability of the sensor to detect changes in both self capacitance and trans-capacitance results in a very versatile system having a wide range of applications.

According to one embodiment of the invention, a position sensor system including sensor array 10 and associated touch detector circuitry will detect a finger position on a matrix of printed circuit board traces via the capacitive effect of finger proximity to the sensor array 10. The position sensor system will report the X, Y position of a finger placed near the sensor array 10 to much finer resolution than the spacing between the sets of first and second traces 14 and 18. The position sensor according to this embodiment may optionally report a Z value proportional to the outline of that finger and hence indicative of the pressure with which the finger contacts the surface of insulating layer 24 over the sensor array 10.

According to a preferred embodiment, a very sensitive, light-touch detector circuit may be provided using adaptive analog VLSI techniques. The circuit preferably is robust and calibrates out process and systematic errors. The detector circuit will be capable of processing the capacitive input information and provide digital information to a microprocessor, as is known in the art and described, for example, in U.S. Pat. Nos. 5,648,642, 7,986,152, 7,859,521, 7,995,041, the disclosures of each of which are incorporated by reference herein in their entireties. Sensing circuitry may be contained on a single sensor processor integrated circuit chip. The sensor processor chip can have any number of X and Y "matrix" inputs. The number of X and Y inputs does not have to be equal. The Integrated circuit may have a digital bus as output. In the embodiments shown in FIGS. 3-5, the sensor array 10 has 15 traces in both the X and Y directions, and consequently, the sensor processor chip will have 15 X inputs and 15 Y inputs. Those skilled in the art will appreciate that if more sensor pads 22 are provided to produce a much larger array, the sensor processor chip will require more X and Y inputs. An exemplary sensing circuitry used to control the touch sensor will be described in more detail below, excerpting portions of the disclosure and drawings from U.S. Pat. No. 5,648,642.

The X and Y matrix nodes are successively scanned, one at a time, with the capacitive information from that scan indicating how close a finger is to that node. The scanned information provides a profile of the finger proximity in each dimension. According to this aspect of the present invention, the profile centroid is derived in both the X and Y directions and is the position in that dimension. The profile curve of proximity is also integrated to provide the Z information.

It will be understood that the row and column directions are defined by an appropriate coordinate system, most commonly an xy Cartesian system in which they are orthogonal, although they may be at a non-orthogonal angle. Moreover, throughout this description, the rows and columns are sometimes referred to as x- or horizontal and y- and vertical respectively for convenience, although this implies no particular alignment to real space, such as relative to the direction of gravity.

Figure 7:
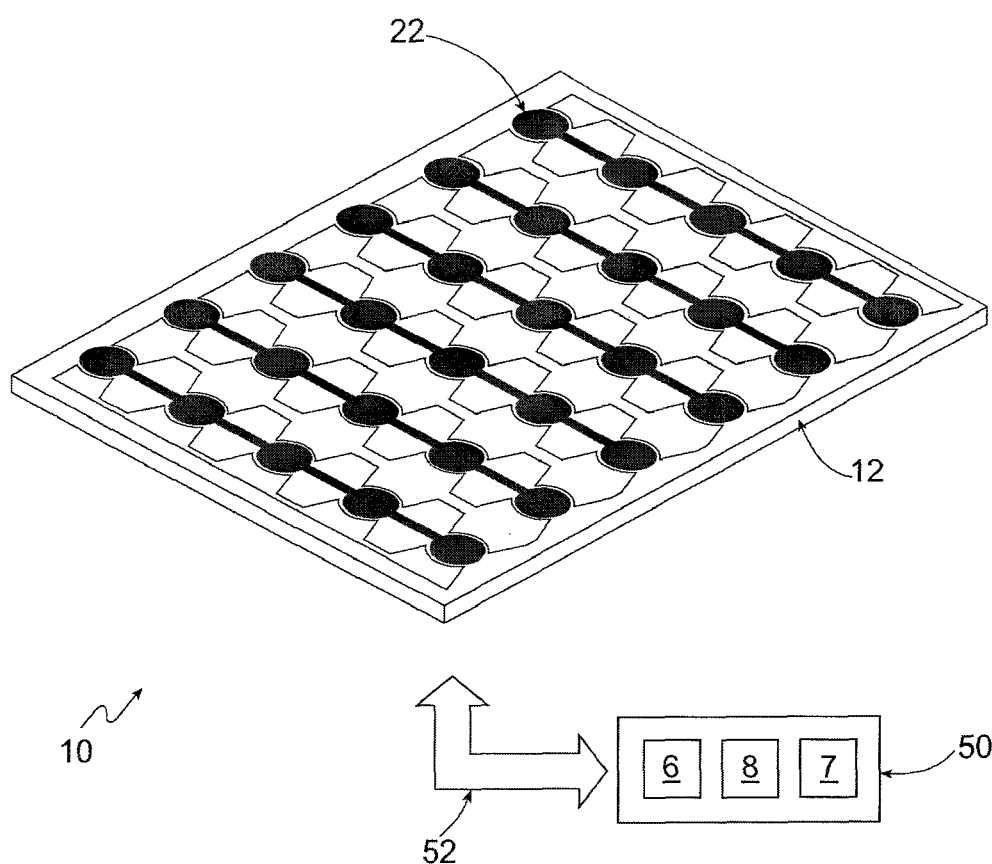
FIG. 7 is a schematic perspective view showing a position sensor according to an embodiment of the invention.

FIG. 7 is a schematic perspective view showing a sensor 10 according to an embodiment of the invention. The sensor 10 comprises a substrate 12 bearing an electrode pattern 22 formed of sensors defining a sensitive area of the sensor and a controller 50. The controller is coupled to electrodes within the electrode pattern by a connection 52. In this embodiment the electrode pattern is confined to one side only of the substrate 12 (the upper side for the orientation shown in FIG. 7). In other examples the electrode pattern 22 may be distributed over both sides of the substrate. The electrode pattern 22 in this perspective view is shown highly schematically. A more representative view of the electrode pattern of the sensor of FIG. 7 is shown in FIG. 9, described further below.

The electrode pattern 22 on the substrate 12 preferably is provided by processing bulk-solidifying amorphous alloy substrate 12 in accordance with preferred embodiments described below. Preferably, the pattern 22 is prepared by subjecting bulk-solidifying amorphous alloy substrate 12 to selective radiation to increase the temperature of the alloy only in the discrete areas shown in FIG. 7, thereby forming an electrically conductive crystal structure in the discrete pattern. In preferred embodiments, the sensor substrate 12 is non-transparent.

The controller 50 provides the functionality of a drive unit 6 for supplying drive signals to portions of the electrode pattern 22, a sense unit 8 for sensing signals from other portions of the electrode pattern 22, and a processing unit 7 for calculating a position based on the different sense signals seen for drive signals applied to different portions of the electrode pattern, as described further below. The controller 50 thus controls the operation of the drive and sense units, and the processing of responses from the sense unit 8 in the processing unit 7, in order to determine the position of an object, e.g. a finger or stylus, adjacent the sensor 10. The drive unit 6, sense unit 8 and processing unit 7 are shown schematically in FIG. 7 as separate elements within the controller 50. However, in general the functionality of all these elements will be provided by a single integrated circuit chip, for example a suitably programmed general purpose microprocessor, or field programmable gate array, or an application specific integrated circuit.

Figure 8:
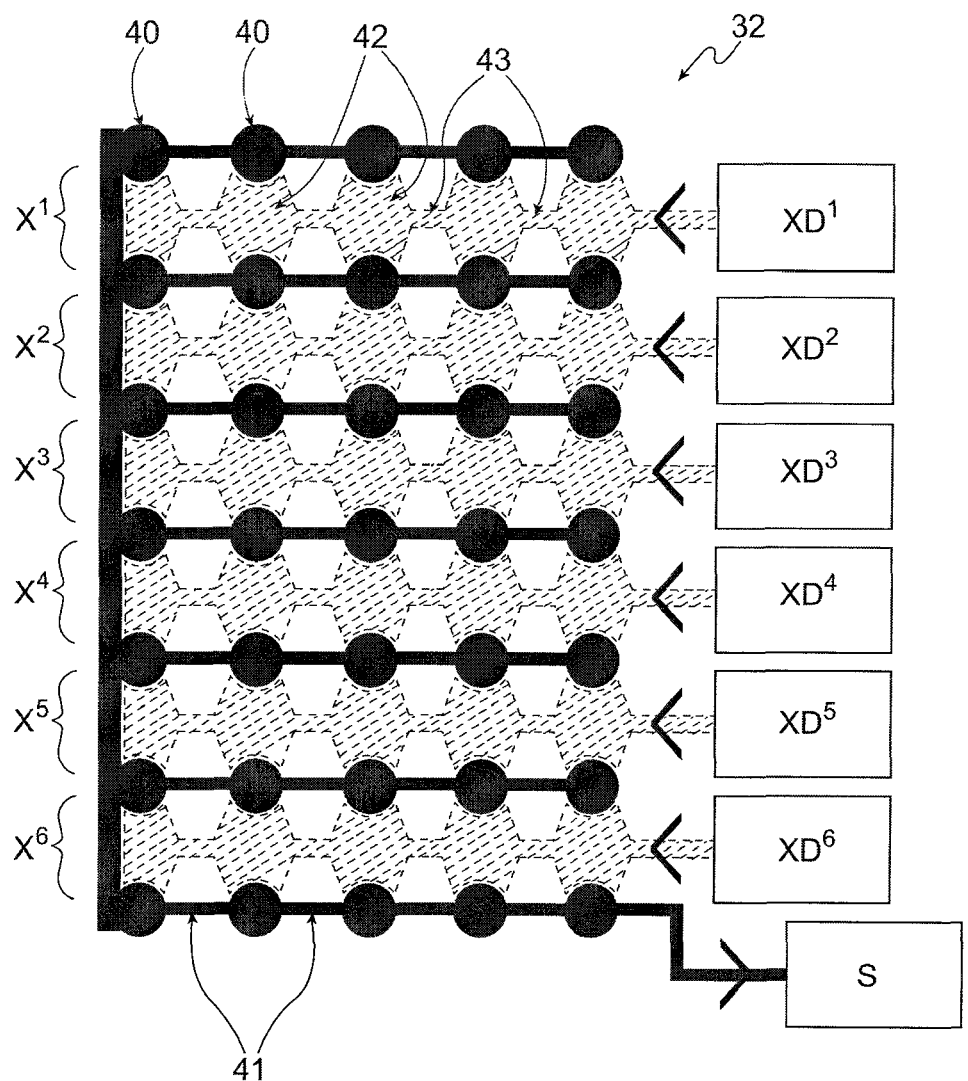
FIG. 8 is a schematic view showing a front side of a position sensor according to an embodiment of the invention and associated drive and sense circuitry.
Figure 9:
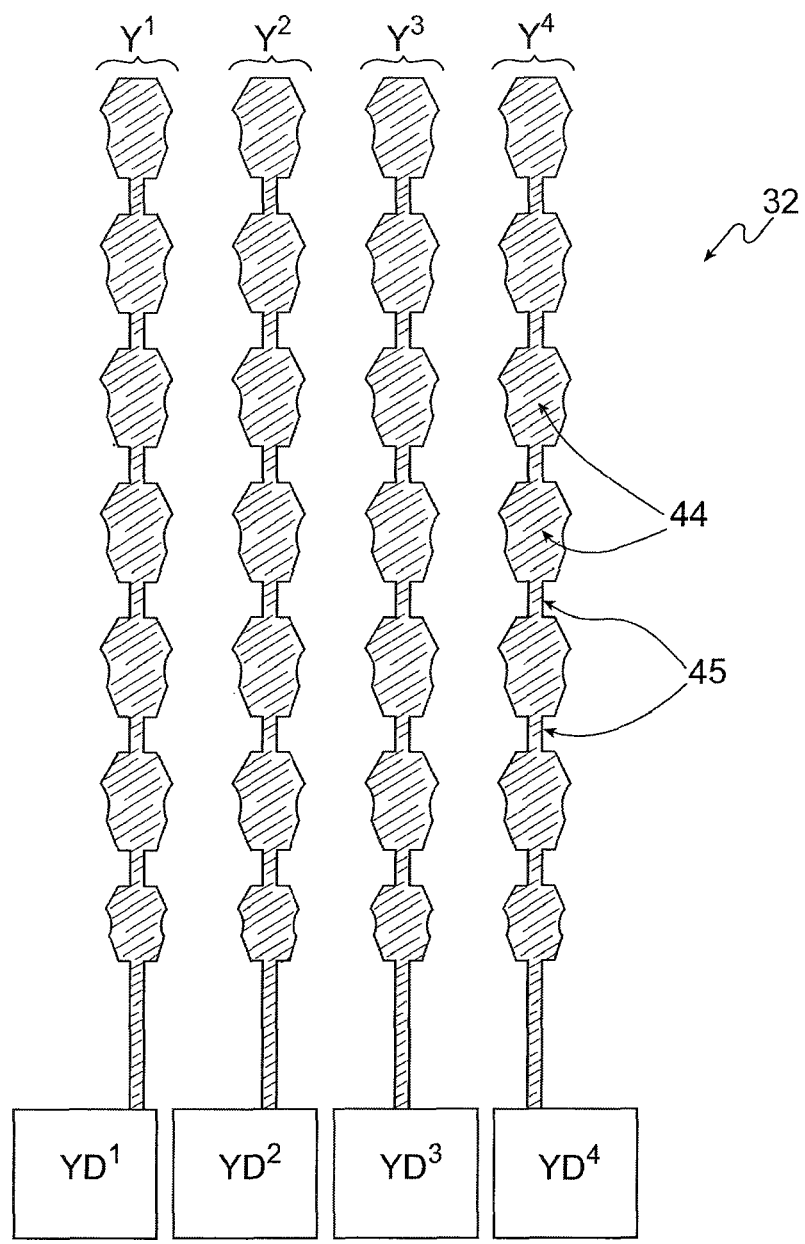
FIG. 9 is a schematic view showing a rear side of the position sensor shown in FIG. 8 with associated drive circuitry.

FIGS. 8 and 9 schematically show respective views of electrode patterning on a front surface and a rear surface of a substrate 12 of a two-dimensional capacitive position sensor 32 according to another embodiment of the invention. The sensor 32 shown in FIGS. 8 and 9 is broadly similar to that shown in FIG. 7, however, it differs in that the electrode patterning is spread over both sides of the sensor substrate. This does not significantly effect other aspects of the sensor. Thus the sensor 32 shown in FIGS. 8 and 9 may include a controller which is largely identical to the controller shown in FIG. 7.

It is noted that FIG. 8 is referred to as a front view and FIG. 9 is referred to as a rear view. However, it will be appreciated that the terms "front" and "rear" are used for convenience to refer to opposing sides (faces) of the sensor substrate. The terms are not intended to imply any particular spatial orientation for the sensor or its substrate. The term front will generally be used to identify the side of a sensor which typically faces an object to be sensed when the sensor is in normal use. The term rear will generally be used to identify the opposing face (i.e. the face which typically faces away from an object to be sensed in normal use). Even so, it will be appreciated that in many, if not all, cases the sensor substrate 12 will be fully reversible in that the sensor will operate regardless of which side a pointing object approaches from (i.e. regardless of which side is considered the front side and which side is considered the rear side).

The electrode patterning on the front side of the substrate (FIG. 8) comprises a plurality of interconnected sense elements 40 (shown black) and a plurality of drive elements 42 (shown medium grey). The sense elements 40 are generally circular in shape and arranged in a regular 5 by 7 array across the sensor substrate. The sense elements 40 are interconnected by an appropriate arrangement of sense elements connection traces 41 (also shown black in FIG. 8). This is achieved in this example by directly connecting each sense element to its neighbors in horizontal rows. As stated above, the traces 41 may be directly connected to each sense element 40, or they may be in electrical connection by virtue of traces 41 being positioned within the surface of substrate 12 such that the crystalline sense elements 40 form a crystal structure from the surface of substrate 12 to the traces 41 embedded therein. The horizontal rows of directly connected sense elements then may be connected together by a connection trace running down the left-hand side of the electrode patterning shown in FIG. 8. Thus all of the sense elements are connected together to provide a single sense electrode comprising interconnected sense elements distributed in both dimensions across the 2D sensitive area of the sensor. The sense electrode is coupled via sense electrode wiring to a sense channel S in a sense unit within the controller of the sensor (e.g. a controller such as shown in FIG. 7). The sense channel S may be controlled by the controller to determine an amount charge coupled into the interconnected group of sense elements, as described, for example, in U.S. Pat. No. 7,986,152, the disclosure of which is incorporated by reference herein in its entirety.

The drive elements 42 on the side of the substrate shown in FIG. 8 are arranged in a regular 5 by 6 array across the sensor substrate. Respective ones of the drive elements are located adjacent to and between respective ones of the sense elements 40. This arrangement thus provides columns of alternating sense and drive elements. The drive elements and the sense elements are closely spaced apart from one another. The drive elements 42 are generally hexagonal (non-regular in this example), but with inwardly curved edges on sides adjacent the sense elements 40 to accommodate the circular shape of the sense elements. The drive elements in each row are connected together by an appropriate arrangement of drive elements connection traces 43 (also shown medium grey in FIG. 8). Drive elements 42 and their connection with connection traces 43 may be fabricated and connected in the same manner as described above with respect to sense elements 40 and connection traces 41.

Thus the plurality of drive elements 42 on the side of the sensor substrate shown in FIG. 8 may be considered as being arranged into six row electrodes $X^1$, $X^2$, $X^3$, $X^4$, $X^5$, and $X^6$. For the orientation shown in FIG. 8, these row electrodes run horizontally and are spaced apart from each other vertically. The terms vertical and horizontal, top and bottom, and so on, will generally be used herein to refer to the orientations of sensors as shown in the drawings, unless the context demands otherwise. It will be appreciated that the terms are not intended to refer to any particular orientation for a sensor when it is in normal use. Furthermore, it will be appreciated the terms column and row are used merely as labels to allow ready distinction between two different arbitrary directions, in this case between a vertical and a horizontal direction, but in general the rows and columns need not be orthogonal.

Each row of drive elements (i.e. each row electrode) is coupled via row drive wiring to a respective drive channel $XD^1$, $XD^2$, $XD^3$, $XD^4$, $XD^5$, and $XD^6$ within the drive unit of the controller of the sensor. In this example a separate drive channel is provided for each row electrode, however, a single drive channel with appropriate multiplexing may also be used. The drive channels are controlled by the controller to apply drive signals to respective ones of the rows of drive elements (row electrodes) as described, for example, in U.S. Pat. No. 7,986,152.

The electrode patterning of the rear side of the substrate (FIG. 9) comprises a further plurality of drive elements 44 (again shown as medium grey in the figure). These drive elements 44 are arranged in a regular 4 by 7 array across the sensor substrate. The location of the drive elements 44 on this side of the substrate relative to the electrode patterning on the face of the substrate shown in FIG. 8 can be seen in FIG. 9 from the light grey representation of the electrode patterning shown in FIG. 8. Thus the drive elements 44 on the rear of the substrate are located (in projected plan view) between the sense elements 40 so as to provide rows of alternating sense and drive elements. The drive elements 44 and the sense elements (in projection) do not overlap. The drive elements 44 are generally hexagonal, but with inwardly curved cut-aways at corners adjacent to the projection of the sense elements 40 onto the rear side of the substrate to accommodate the circular shape of the sense elements without overlapping. The drive elements 44 in each column are connected together by an appropriate arrangement of drive elements column connection traces 45 (also shown medium grey in FIG. 9). Drive elements 44 and their connection with connection traces 45 may be fabricated and connected in the same manner as described above with respect to sense elements 40 and connection traces 41. Thus the plurality of drive elements 44 on the rear side of the sensor substrate shown in FIG. 9 may be considered as being arranged into four column electrodes $Y^1$, $Y^2$, $Y^3$, and $Y^4$. These column electrodes run vertically and are spaced apart from each other horizontally for the orientation shown in FIG. 9.

Each column of drive elements 44 is coupled via column drive wiring to a respective drive channel $YD^1$, $YD^2$, $YD^3$, and $YD^4$ within the sensor controller. These drive channels may be identical to the drive channels $XD^1$, $XD^2$, $XD^3$, $XD^4$, $XD^5$, and $XD^6$ coupled to the row electrodes. In this example a separate drive channel is provided for each column electrode. However, a single drive channel with appropriate multiplexing may also be used. The drive channels are controlled by the controller to apply drive signals to respective ones of the columns of drive elements 44. (A single drive channel with appropriate multiplexing may provide the functionality of all drive channels $XD^1$, $XD^2$, $XD^3$, $XD^4$, $XD^5$, $XD^6$, $YD^1$, $YD^3$, and $YD^4$.)

Figure 10:
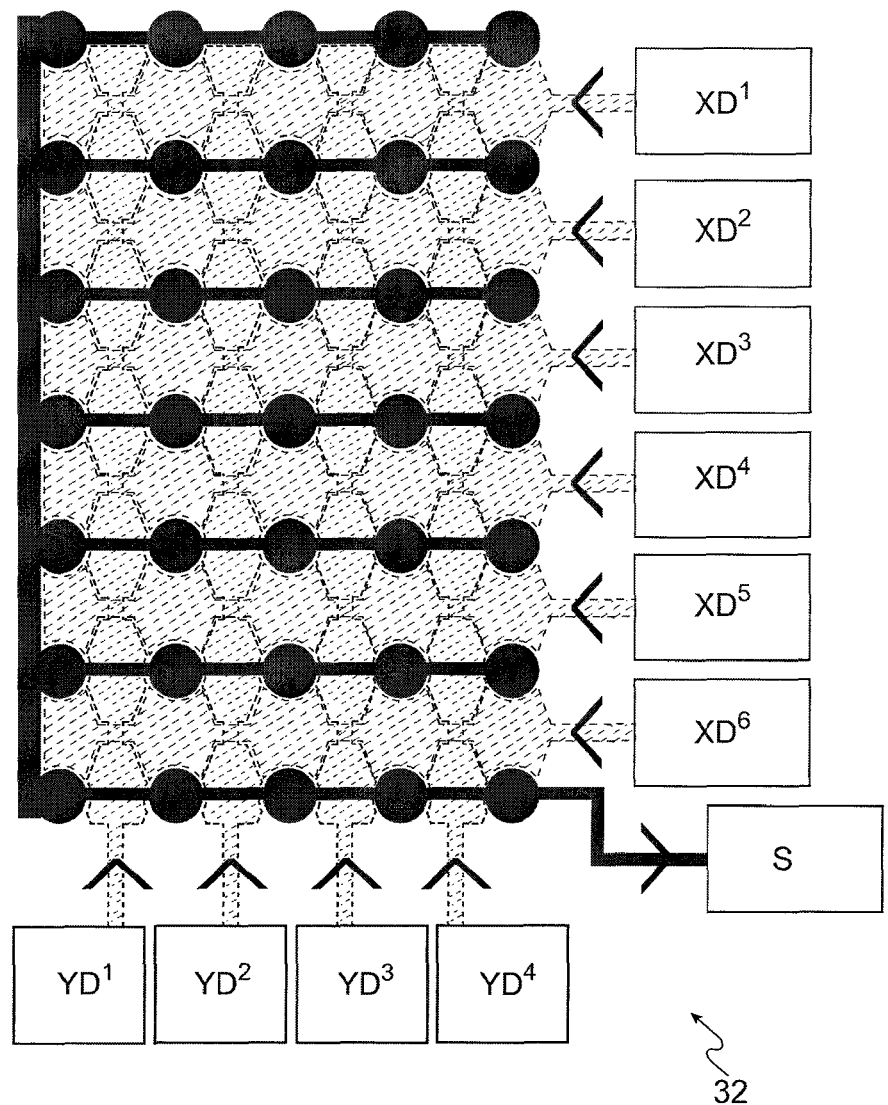
FIG. 10 is a schematic view showing a composite view of both sides of the position sensor shown in FIGS. 8 and 9 and associated drive and sense circuitry.

FIG. 10 schematically shows a front plan view of the sensor 32 shown in FIGS. 8 and 9 in which the electrode patterning on both the front side (FIG. 8) and the rear side (FIG. 9) are shown together. Thus the sensor 32 comprises a plurality of driven row electrodes, a plurality of driven column electrodes, and a single sense electrode comprising a network of interconnected sense elements interspersed among the driven row and column electrodes across the sensitive area of the sensor. Each neighboring pairing of a drive element 42, 44 and a sense element 40 (as seen in projection, i.e. regardless of whether the drive and sense element are on the same side of the substrate) can be considered to correspond to a discrete sensor area which may be operated according to the techniques described in U.S. Pat. No. 6,452,514, the disclosure of which is incorporated by reference herein in its entirety. The manner of operation for the sensor 32 shown in FIGS. 8 to 10 is similar to and will be understood by those skilled in the art with reference to any number of touch sensing disclosures, including, for example, U.S. Pat. Nos. 5,648,642, 7,986,152, 7,859,521, 7,995,041, the disclosures of each of which are incorporated by reference herein in their entireties. The sensor 10 and 32 can be operated in accordance with the procedures described in these documents, and the particular circuitry involved is not critical to the present embodiments.

In another embodiment, the drive and sense electrodes may be formed in a bulk-solidifying amorphous alloy substrate, and these electrodes may provide multi-function circuit elements useful in the touch screens described in U.S. Pat. Nos. 7,859,521, 7,995,041, the disclosures of each of which are incorporated by reference herein in their entireties. The multi-function circuit elements can be, for example, capacitors in display pixels that can be configured to operate as storage capacitors/electrodes, common electrodes, conductive wires/pathways, etc., of the display circuitry in the display system, and that may also be configured to operate as circuit elements of the touch sensing circuitry.

The substrate used to form the sensing and drive elements described herein can be used to form any of the sensing elements typically found in touch sensor devices (sense pads, interactive display screens, and the like). The particular arrangement of sensors, and/or sensor and drive elements that are described above are not critical to the embodiments described herein. The use of a bulk-solidifying amorphous alloy as substrate 12, and the ability to form discrete areas of crystallinity enable any particular arrangement throughout the substrate for sensors and/or drive elements. Suitable bulk-solidifying amorphous alloys for use as substrate, and methods of processing the substrate to form the sensor are described in more detail below.

To form the sensors described herein, a bulk-solidifying amorphous alloy is first fabricated into the desired shape and size for the desired sensor. This may be rectangular, square, may have a 3-dimensional dome-shape, and may have any suitable thickness as is customary in the art. The use of the bulk-solidifying amorphous alloy enables easier processing of the substrate to form the sensor, and enables the fabrication of intricately designed sensors that can have superior precision and performance, when compared to conventional sensors made using conventional substrates or transparent printed material.

The method of fabricating the sensor can be carried out to form discrete regions of crystallinity within the bulk-solidifying amorphous alloy. Fabricating semiconductor substrates to form areas of crystallinity within amorphous regions is known in the art, and described for example, in U.S. Pat. Nos. 4,450,041, 4,661,201, 6,117,725, 6,200,893, and 6,780,766, the disclosures of which are incorporated by reference herein in their entireties. As conventional in the art, a substrate comprised of an amorphous material may be subjected to an external force to convert all or a portion of the surface to a crystalline phase using either a selective application of force, or use of a mask. Portions of either the crystalline phase or amorphous phase then can be removed and further processed to form integrated circuits. The processing typically takes a number of steps and usually involves repeated exposures, removals, coatings and the like.

Figure 11:
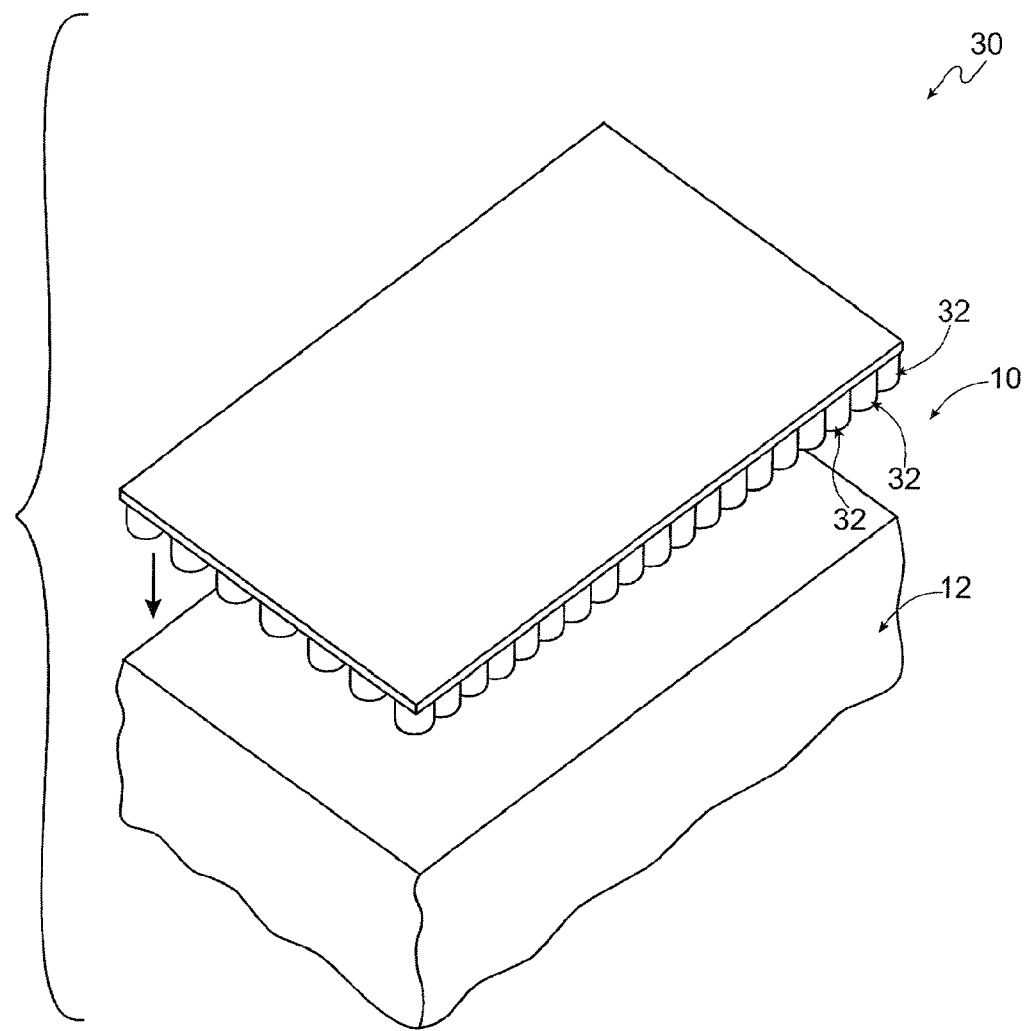
FIG. 11 is a view of a fragment of a bulk-solidifying amorphous alloy substrate at a processing stage, and illustrates an exemplary process that can be utilized for forming the sensors shown in FIGS. 3-10.
Figure 12:
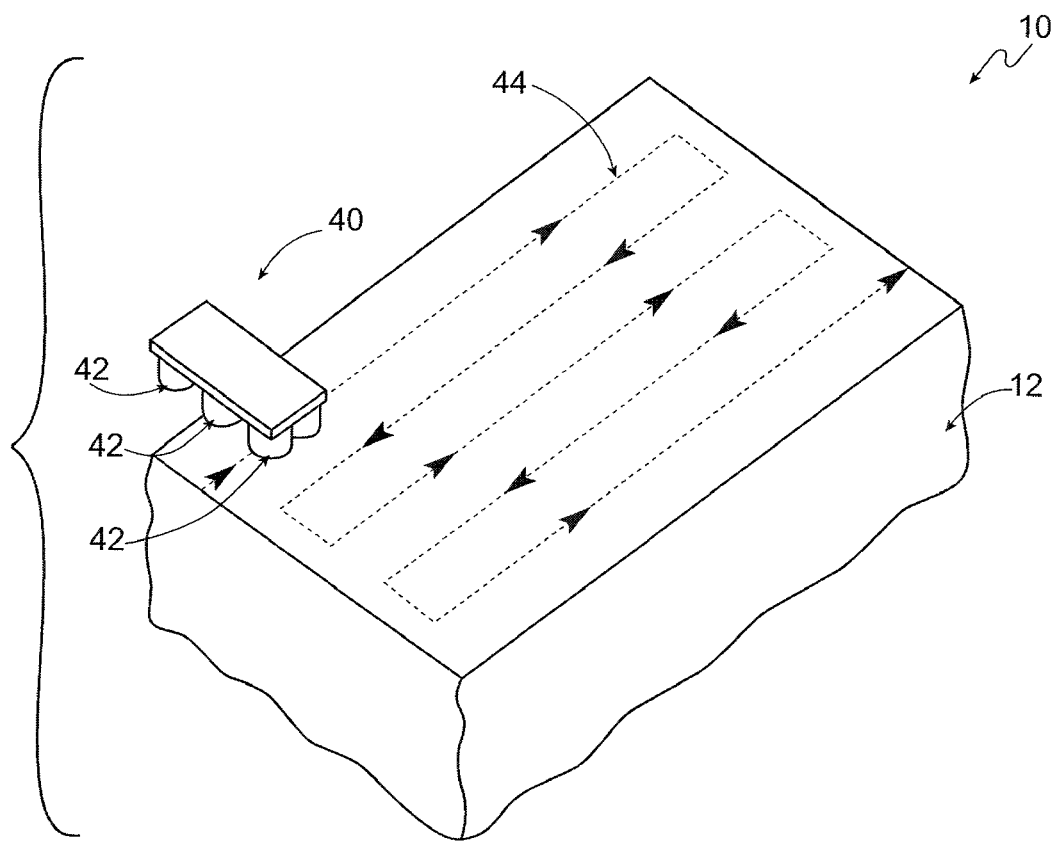
FIG. 12 is another view of a fragment of a bulk-solidifying amorphous alloy substrate at a processing stage, and illustrates another exemplary process that can be utilized for forming the sensors shown in FIGS. 3-10.

The bulk-solidifying amorphous alloy substrate of the preferred embodiments need only be subjected to radiation to form discrete areas of crystallinity, without the need of additional removal, coating, and the like. FIGS. 11 and 12 illustrate exemplary apparatus that can be utilized for forming the substantially crystalline regions to form sensors 22 in FIGS. 3-6, and for forming sense elements 40, and drive elements 42 and 44 in FIGS. 7-10. Referring now to FIG. 11, sensor 10 is shown together with an assembly 30. Assembly 30 comprises a plurality of tips 32 (only some of which are labeled) capable of emitting radiation to heat discrete portions of substrate 12 to form an array extending across the entire upper surface of substrate 12. Tips 32 can comprise any shape suitable for forming sensors 22, 40, or drive elements 42, 44, including circular, diamond shaped, rectangular, square, or most preferably, a pin point. In operation, apparatus 30 can be lowered onto substrate 12 so that the tips 32 impact regions of substrate 12 and thereby form the crystalline regions within substrate 12.

The tips 32 are designed to emit radiation suitable to heat the surface, and preferably portions underlying the surface of substrate 12 discretely and selectively to a temperature sufficient to enable the formation of a crystalline phase in the area upon which tips 32 contact, or nearly contact the surface of substrate 12. The temperature sufficient to enable the formation of a crystalline phase will depend on the composition of the particular alloy employed as substrate 12. Those skilled in the art will be capable of determining the appropriate amount of radiation depending on the composition of the substrate 12 and the desired crystalline thickness (e.g., how deep into substrate 12 the crystalline phase will form to electrically connect with tracers that are positioned within the substrate (not shown in FIGS. 11 and 12), using the guidelines provided herein (e.g., referring to FIG. 2, knowing the Tg, Tx, and Tm of the specific alloy). Thus, radiation can be applied to heat the alloy to the appropriate temperature so that when it cools, preferably without rapid cooling, the alloy forms a crystalline phase in the specific area in which the radiation was applied.

In another aspect of the invention, apparatus 30 can be replaced with an apparatus suitable for providing patterned laser-emitted light across an entire surface of substrate 12. For example, the tips 32 described above can be replaced with laser-emitting tips 32. The laser-emitted radiation can then be utilized for forming the crystalline regions described above with reference to the figures.

FIG. 12 illustrates alternative methodology for forming crystalline regions for forming sensors 22, 40, or drive elements 42, 44. Specifically, sensor 10 is shown proximate an assembly 40 comprising tips 42 (only some of which are labeled). The number of tips 42 of assembly 40 corresponds to a subset of the total number of crystalline regions to be formed in substrate 12. In the shown aspect of the invention, such subset is 6 tips, but it is to be understood that fewer than 6 tips can be utilized (for example, a single tip can be utilized), or more than 6 tips can be utilized. In operation, assembly 40 is rastored relative to an upper surface of material 14 and sequentially utilized to form the crystalline regions for forming sensors 22, 40, or drive elements 42, 44. An exemplary rastoring pattern 44 is diagrammatically illustrated with a dashed line over an upper surface of substrate 12. The tips in assembly 40 can be replaced with other structures suitable for forming crystalline regions. For example, the heated tips can be replaced with structures suitable for directing laser-emitted light (such as, for example, light pipes), and the laser-emitted light can be utilized for forming a pattern of crystalline regions within substrate 12.

Sensing Circuitry

Figure 13:
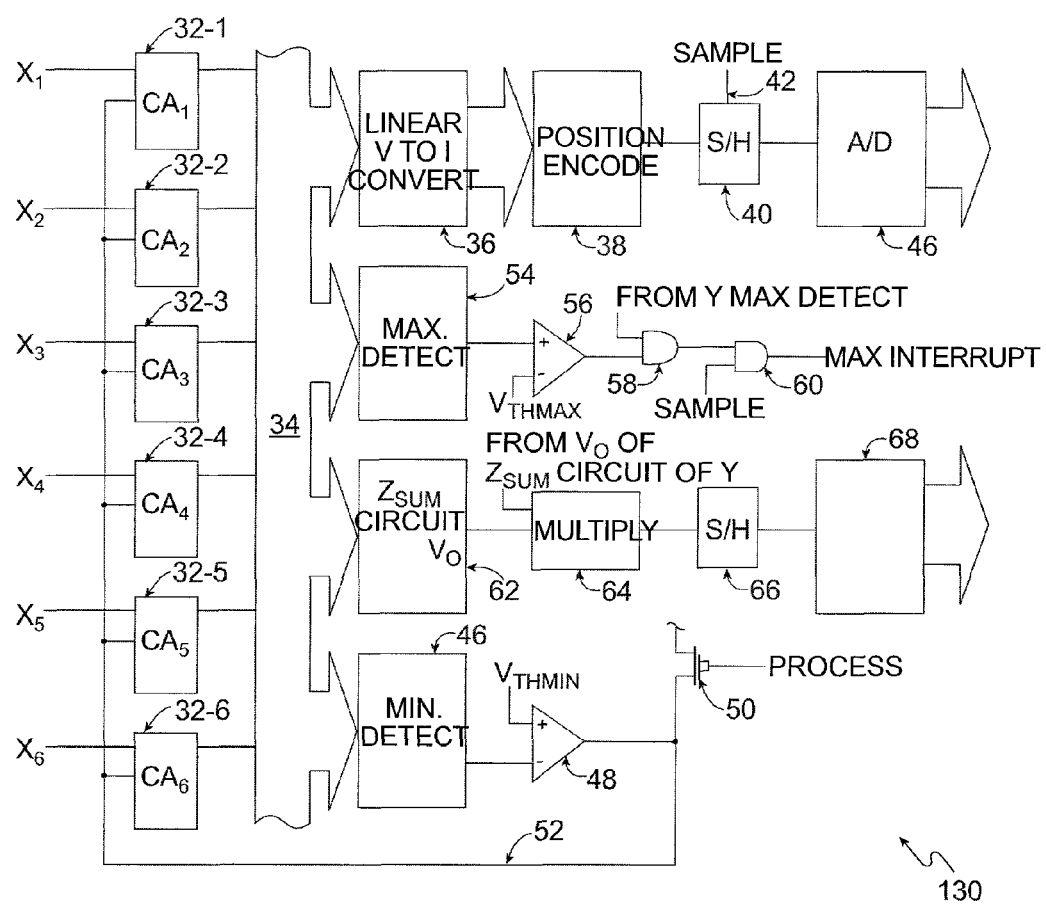
FIG. 13 is a block diagram of sensor decoding electronics that may be used with the sensor transducer shown in FIGS. 3-6.

Referring now to FIG. 13, a block diagram of presently preferred sensing circuitry 30 for use according to the present invention is shown. The sensing circuitry 30 of this embodiment employs a driving-point capacitance measurement for each X and Y line in the sensor array 10. The block diagram of FIG. 13 illustrates the portion of the sensing circuitry 30 for developing signals from one direction (shown as X in the matrix). The circuitry for developing signals from the other direction in the matrix is identical and its interconnection to the circuitry shown in FIG. 13 will be disclosed herein. The sensing circuitry 30 of FIG. 13 illustratively discloses an embodiment in which information from six X matrix lines X1 . . . X6 are processed. Those of ordinary skill in the art will recognize that this embodiment is illustrative only, and that actual embodiments fabricated according to the present invention may employ an arbitrarily sized matrix, limited only by technology constraints.

The driving-point capacitance measurement for each of X lines X1 . . . X6 is derived from an integrating charge amplifier circuit. These circuits are shown in block form at reference numerals 32-1 through 32-6. The function of each of integrating charge amplifier 32-1 through 32-6 is to develop an output voltage proportional to the capacitance sensed on its corresponding X matrix line.

The driving-point capacitance measurement is made for all X (row) first conductive traces 14 and all Y (column) second conductive traces 18 in the sensor matrix array 10. A profile of the finger proximity mapped into the X and Y dimension is generated from the driving-point capacitance measurement data. This profile is then used to determine a centroid in both dimensions, thereby determining the X and Y position of the finger.

The output voltages of integrating charge amplifier 32-1 through 32-6 are utilized by several other circuit elements and are shown for convenience in FIG. 13 as distributed by bus 34. Bus 34 is a six conductor bus, and those of ordinary skill in the art will recognize that each of its conductors comprises the output of one of integrating charge amplifiers 32-1 through 32-6.

The first of circuit elements driven by the outputs of integrating charge amplifier circuits 32-1 through 32-6 is linear voltage-to-current converter 36. The function of linear voltage-to-current converter 36 is to convert the output voltages of integrating charge amplifiers 32-1 through 32-6 to currents for subsequent processing.

The current outputs from linear voltage-to-current converter 36 are presented as inputs to X position encode circuit 38. The function of X position encode circuit 38 is to convert the input information into a signal representing object proximity in the X dimension of the sensor array 10. According to a presently preferred embodiment of the invention, this circuit will provide a scaled weighted mean (centroid) of the set of input currents. The result is a circuit which is a linear position encoder, having an output voltage which varies between the power supply rails. Because it is a weighted mean, it averages all current inputs and can in turn generate an output voltage which represents an X position with a finer resolution than the spacing of the X matrix grid spacing.

The output voltage of X position encode circuit 38 is presented to sample/hold circuit 40, the output of which, as is well known in the art, either follows the input or holds a value present at the input depending on the state of its control input 42. The structure and operation of sample/hold circuits are well known in the art.

The output of sample/hold circuit 40 drives the input of analog-to-digital (A/D) converter 44. The output of ND converter 44 is a digital value proportional to the position of the object in the X dimension of the sensor array 10.

While the portion of the circuit described so far is useful for providing a digital signal indicating object position in one dimension, the addition of further circuit elements yields a more useful device which is more immune to noise, detects and subtracts the no-object-proximate signal from the outputs of the sensors, and provides threshold detection of an approaching object.

The first of these additional circuit elements is minimum detector circuit 46. The function of minimum detector circuit 46 is to determine the level of signal representing ambient no-object-proximate to the sensor array 10 and to provide a signal which may be fed back to integrating charge amplifiers 32-1 through 32-6 to control their output voltages to effectively zero out the outputs of the integrating charge amplifiers 32-1 through 32-6 under the ambient condition. The output of minimum detector circuit 46 is a voltage. This voltage is compared in operational amplifier 48 with an adjustable voltage representing a minimum threshold value $V_{Thmin}$. Through feedback to the integrating charge amplifiers 32-1 through 32-6, operational amplifier 48 adjusts its output to balance the output voltage of minimum detector circuit 46 with the voltage $V_{Thmin}$. Feedback is controlled by P-channel MOS transistor 50, which allows the feedback to operate only when the PROCESS signal is active.

Figure 14:
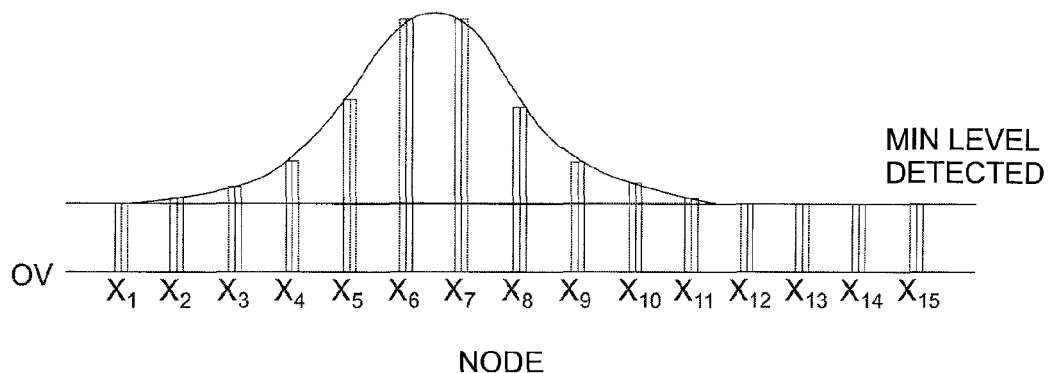
FIGS. 14 and 15 are graphs of output voltage versus matrix conductor position which illustrate the effect of the minimum detector of FIG. 13.
Figure 15:
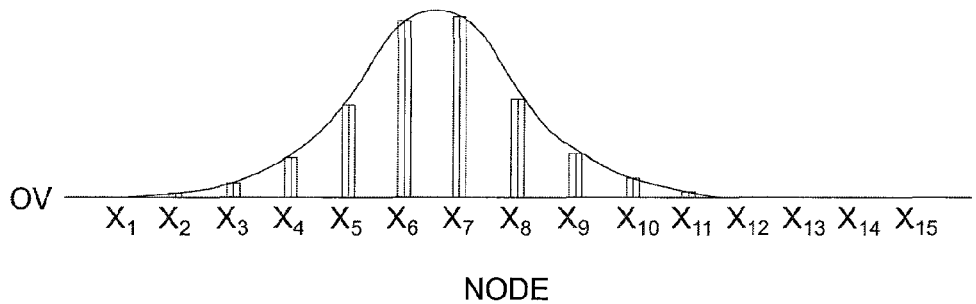

FIGS. 14 and 15 are graphs of output voltage versus matrix conductor position which illustrate the effect of the minimum detector circuit 46. In order to better illustrate the effect of offset cancellation, FIGS. 14 and 15 show the outputs of integrating charge amplifiers from a fifteen row matrix, rather than from a six row matrix as is implied by FIG. 13. FIG. 14 shows the offset component of the voltage outputs of integrating charge amplifiers without the operation of minimum detector circuit 46, and FIG. 15 shows the voltage outputs with the offset having been zeroed out by the feedback loop comprising minimum detector circuit 46, P-channel MOS transistor 50, and feedback conductor 52.

Another additional circuit component is maximum detector circuit 54. The function of maximum detector circuit 54, working in co-operation with amplifier 56, OR gate 58, and AND gate 60 is to provide a MAX INTERRUPT signal. The MAX INTERRUPT signal alerts the microprocessor controlling the object sensor system of the present invention that an object is approaching the sensor array 10. The amplifier 56 acts as a comparator which trips if the output voltage from maximum detector circuit 54 exceeds the threshold set by the voltage $V_{Thmin}$. When the output voltage from maximum detector circuit 54 exceeds the threshold, or the output voltage from the corresponding Y maximum detector (not shown) exceeds the threshold set for its corresponding amplifier, the output of OR gate 58 becomes true. That and a true SAMPLE signal at the second input of AND gate 60 causes a true MAX INTERRUPT signal at its output.

The Z Sum circuit 62 produces an output which is proportional to the pressure with which a finger is pressing on the sensor. This is done In both the X and Y dimensions by effectively integrating the areas under the curves of FIG. 15. Referring again to FIG. 15 for illustration purposes, it can be seen that the width of the contact area in the X dimension of the sensor array 10 is from about $X_2$ to $X_{10}$.

According to a presently preferred embodiment of the invention, Z Sum circuit 62 is configured to produce an output voltage $V_O$. Output voltage $V_O$ is a scaled function of all the input voltages.

Since the outputs of the Z Sum circuits 62 in both the X and Y directions are proportional to the width of the pointing finger or other flexible object in the two dimensions of the sensor array 10, the area of the finger or other flexible object is a reliable measure of the pressure with which the finger is contacting the surface of the sensor array 10. The area may be calculated by multiplier circuit 64, having the output of the Z Sum circuit 62 in the X dimension as one of its inputs and the output of the Z Sum circuit 62 in the Y dimension as the other one of its inputs.

A presently preferred embodiment of multiplier circuit 64 takes two analog voltage inputs and performs an analog computation on those voltages to create a voltage output which is proportional to the product of the two input voltages. As shown in FIG. 13, a first input term is the output voltage of the X dimension Z Sum circuit 62 and a second input term is the output of the Y dimension Z Sum circuit (not shown). Those of ordinary skill in the art will recognize that since multiplication is commutative process and since the multiplier inputs are symmetrical, it does not matter which of the X and Y Z sum circuits 62 contributes the first input term and which contributes the second input term.

The output of multiplier circuit 64 is a voltage and drives a sample/hold circuit 66. Sample/hold circuit 66 may be identical to sample/hold circuit 40 and may be driven by the same SAMPLE signal which drives sample/hold circuit 40.

The output of sample/hold circuit 66 drives the input of analog-to-digital (A/D) converter 68. ND converter 68 may be identical to A/D converter 44. The output of A/D converter 68 is a digital value proportional to the pressure with which the finger (or other flexible object) is contacting the surface of sensor array 10.

The object position sensor system of the present invention may be operated under the control of a microprocessor which provides the timing and other control signals necessary to operate the system. For example, the MAX INTERRUPT signal from the output of AND gate 60 may be used to interrupt the microprocessor and invoke an object sensing routine. The particular timing and control signals employed by any system constructed according to the present invention will vary according to the individual design. The following is therefore an illustrative disclosure providing circuit details of illustrative circuit components of a presently preferred system according to the present invention and including disclosure of typical timing and control signals for operating these circuits.

While the invention has been described with reference to particularly preferred embodiments, those skilled in the art will appreciate that various modifications may be made thereto without departing from the spirit and scope thereof.

What is claimed:

1. A touch sensing system comprising:
   a substrate comprising sense pads, each defined by a region of a crystalline form of a metal alloy and adjacent a region of an amorphous form of the metal alloy;
   conducting traces in electrical connection with the sense pads; and
   a control unit connected to at least one of the conducting traces and configured to calculate a position of an object relative to the substrate; wherein
   each sense pad forms at least one circuit element.

2. The touch sensing system as claimed in claim 1, wherein:
   the substrate comprises:
      an upper surface; and
      a lower surface opposite the upper surface; and
   at least a subset of the sense pads are positioned on the upper surface.

3. The touch sensing system as claimed in claim 2, wherein:
   the subset of sense pads is a first subset; and
   at least a second subset of the sense pads is positioned on the lower surface.

4. The touch sensing system as claimed in claim 1, wherein:
   the substrate comprises:
      an upper surface; and
      a lower surface opposite the upper surface;
   the regions of the crystalline form of the metal alloy extend through the substrate from the upper surface to the lower surface; and
   the conducting traces are disposed on the lower surface in electrical connection with the regions of the crystalline form of the metal alloy.

5. The touch sensing system as claimed in claim 1, wherein:
   the substrate comprises:
      an upper surface; and
      a lower surface opposite the upper surface;
   the regions of the crystalline form of the metal alloy extend at least partially through the substrate from the upper surface to the lower surface; and
   the conducting traces are disposed within the substrate and are in electrical connection with the regions of the crystalline form of the metal alloy.

6. The touch sensing system as claimed in claim 1, wherein the metal alloy is described by the following molecular formula: $(Zr, Ti)_a(Ni, Cu, Fe)_b(Be, Al, Si, B)_c$, wherein "a" is in the range of from 30 to 75, "b" is in the range of from 5 to 60, and "c" is in the range of from 0 to 50 in atomic percentages.

7. The touch sensing system as claimed in claim 1, wherein the metal alloy is described by the following molecular formula: $(Zr, Ti)_a(Ni, Cu)_b(Be)_c$, wherein "a" is in the range of from 40 to 75, "b" is in the range of from 5 to 50, and "c" is in the range of from 5 to 50 in atomic percentages.

8. The touch sensing system as claimed in claim 1, wherein the metal alloy can sustain strains up to 1.5% or more without sustaining permanent deformation or breakage.

9. The touch sensing system as claimed in claim 1, wherein the at least one circuit element is selected from the group consisting of a sensing element, a drive element, a capacitive element, and a common electrode of a display system.

10. An electronic device comprising:
    a substrate comprising:
       a base portion comprising an amorphous form of a metal alloy; and
       first crystalline regions formed in the base portion and comprising a crystalline form of the metal alloy;
    conducting traces in electrical connection with the first and second crystalline regions; and
    a control unit connected to at least one of the conducting traces and configured to determine a capacitance between at least one of the first crystalline regions and at least one of the second crystalline regions.

11. The electronic device as claimed in claim 10, wherein the device is selected from one or more of the group consisting of a telephone, a cell phone, a land-line phone, a smart phone, an electronic email sending/receiving device a television, an electronic-book reader, a portable web-browser, a computer monitor, a DVD player, a Blue-Ray disk player, a video game console, a music player, a device that provides controlling the streaming of images, videos, and sounds, a remote control, a watch, and a clock.

12. The electronic device of claim 10, wherein:
    the first crystalline regions are drive elements of the touch sensing system; and
    the second crystalline regions are sense elements of the touch sensing system.

13. The electronic device of claim 10, wherein:
    the substrate defines:
       a first surface; and
       a second surface opposite the first surface;

the first crystalline regions each define:
- a sensing surface substantially parallel to the first surface; and
- a back surface substantially parallel to the second surface; and the conducting traces are coupled to the back surfaces.

14. The electronic device of claim 13, wherein:
the sensing surfaces are substantially coplanar with the first surface; and
the back surfaces are substantially coplanar with the second surface.

15. A component for a touch sensing system, comprising:
a monolithic substrate formed from a metal alloy having a single chemical composition, comprising:
- an amorphous portion of the metal alloy defining a first portion of the substrate; and
- crystalline regions of the metal alloy defining a second portion of the substrate; and conducting traces electrically connected to the crystalline regions and configured to be electrically connected to a control unit of the touch sensing system.

16. The component of claim 15, wherein the conducting traces are disposed on a surface of the substrate.

17. The component of claim 15, wherein:
the crystalline regions have a first electrical conductivity; and
the amorphous portion has a second electrical conductivity that is lower than the first electrical conductivity.

18. The component of claim 17, wherein the amorphous portion insulates at least some of the crystalline regions from each other.

19. The component of claim 15, wherein:
the substrate defines a first surface;
the substrate further defines a second surface opposite, and set apart from, the first surface by a thickness;
each of a first subset of the crystalline regions extends from the first surface to a first depth that is less than the thickness of the substrate; and
each of a second subset of the crystalline regions extends from the second surface to a second depth that is less than the thickness of the substrate.

20. The component of claim 15, wherein:
the substrate defines:
- a first surface; and
- a second surface opposite the first surface; and each of the crystalline regions extends from the first surface to the second surface.

* * * * *